United States Patent
Grauer et al.

(10) Patent No.: US 9,723,233 B2
(45) Date of Patent: *Aug. 1, 2017

(54) CONTROLLABLE GATED SENSOR

(71) Applicant: BRIGHTWAY VISION LTD., Haifa (IL)

(72) Inventors: Yoav Grauer, Haifa (IL); Eyal Levi, Haifa (IL)

(73) Assignee: BRIGHTWAY VISION LTD., Haifa (IL)

( * ) Notice: Subject to any disclaimer, the term of this patent is extended or adjusted under 35 U.S.C. 154(b) by 0 days.

This patent is subject to a terminal disclaimer.

(21) Appl. No.: 15/226,973

(22) Filed: Aug. 3, 2016

(65) Prior Publication Data
US 2016/0344965 A1 Nov. 24, 2016

Related U.S. Application Data

(63) Continuation-in-part of application No. 15/010,229, filed on Jan. 29, 2016, which is a continuation-in-part
(Continued)

(51) Int. Cl.
*H04N 5/378* (2011.01)
*H04N 5/353* (2011.01)
(Continued)

(52) U.S. Cl.
CPC ..... *H04N 5/35572* (2013.01); *H01L 27/1203* (2013.01); *H01L 27/14609* (2013.01);
(Continued)

(58) Field of Classification Search
CPC ......... H01L 27/14612; H01L 27/14621; H01L 27/14875; H01L 27/14887; H04N 5/33;
(Continued)

(56) References Cited

U.S. PATENT DOCUMENTS 6,057,909 A 5/2000 Yahav et al.
6,373,557 B1 4/2002 Mengel et al.
(Continued)

FOREIGN PATENT DOCUMENTS

CN 101715041 5/2010
EP 1 118 208 11/2004
(Continued)

OTHER PUBLICATIONS

International Search Report for International Application No. PCT/IL2013/050331 date of mailing Aug. 5, 2013.
(Continued)

*Primary Examiner* — Mark R Gaworecki
(74) *Attorney, Agent, or Firm* — Pearl Cohen Zedek Latzer Baratz LLP

(57) ABSTRACT

A single pixel sensor is provided, comprising a photo sensor configured to convert light into proportional signals; a charge storage configured to accumulate, repeatedly, a plurality of the signals converted by the photosensor; a first transistor coupled between a pixel voltage terminal and the photosensor; a second transistor coupled between the photosensor and the charge storage; and a readout circuit coupled between the charge storage and an output channel, wherein: the single pixel sensor is configured to carry out the repeated accumulations of signals multiple times per each readout by the readout circuit to synchronously convert reflections of light emitted by the illuminator, and to carry out at least one of the repeated accumulations of signals in at least partial overlap with at least one light pulse generated by the pulsed illuminator.

33 Claims, 20 Drawing Sheets

Related U.S. Application Data of application No. 14/924,878, filed on Oct. 28, 2015, which is a continuation of application No. 14/700,191, filed on Apr. 30, 2015, now Pat. No. 9,219,873, which is a continuation of application No. 14/394,576, filed as application No. PCT/IL2013/050331 on Apr. 17, 2013, now Pat. No. 9,088,744.

(60) Provisional application No. 61/625,756, filed on Apr. 18, 2012.

(51) Int. Cl.

| | |
|---|---|
| H01L 27/146 | (2006.01) |
| H01L 27/148 | (2006.01) |
| H04N 5/355 | (2011.01) |
| H04N 5/359 | (2011.01) |
| H01L 27/12 | (2006.01) |
| H04N 5/225 | (2006.01) |
| H04N 5/33 | (2006.01) |
| H04N 9/04 | (2006.01) |

(52) U.S. Cl.
CPC .. *H01L 27/14621* (2013.01); *H01L 27/14634* (2013.01); *H01L 27/14643* (2013.01); *H01L 27/14656* (2013.01); *H04N 5/2256* (2013.01); *H04N 5/332* (2013.01); *H04N 5/353* (2013.01); *H04N 5/3592* (2013.01); *H04N 5/3594* (2013.01); *H04N 5/35536* (2013.01); *H04N 9/045* (2013.01); *H01L 27/14627* (2013.01)

(58) Field of Classification Search
CPC .............. H04N 5/353; H04N 5/35536; H04N 5/35572; H04N 5/3591; H04N 5/3592; H04N 5/3594; H04N 5/378
See application file for complete search history.

(56) References Cited

U.S. PATENT DOCUMENTS

| | | |
|---|---|---|
| 6,831,689 B2 | 12/2004 | Yadid-Pecht |
| 7,733,464 B2 | 6/2010 | David et al. |
| 2002/0000508 A1 | 1/2002 | Muramatsu et al. |
| 2003/0155513 A1 | 8/2003 | Remillard et al. |
| 2003/0227018 A1 | 12/2003 | Fox |
| 2005/0269482 A1 | 12/2005 | Hopper et al. |
| 2007/0058038 A1 | 3/2007 | David et al. |
| 2007/0091175 A1 | 4/2007 | Iddan et al. |
| 2010/0231771 A1 | 9/2010 | Yaghmai |
| 2011/0013065 A1 | 1/2011 | Shinohara |
| 2011/0080500 A1 | 4/2011 | Wang et al. |
| 2012/0033118 A1 | 2/2012 | Lee et al. |
| 2013/0181119 A1 | 7/2013 | Bikumandla et al. |
| 2015/0009375 A1 | 1/2015 | Agranov et al. |
| 2015/0156387 A1 | 6/2015 | Miyakoshi |

FOREIGN PATENT DOCUMENTS

| | | |
|---|---|---|
| WO | WO 97/40620 | 10/1997 |
| WO | WO 00/52926 | 9/2000 |
| WO | WO 01/10110 | 2/2001 |
| WO | WO 2007/024582 | 3/2007 |
| WO | WO 2010/084493 | 7/2010 |

OTHER PUBLICATIONS

Supplementary European Search Report of EP Application No. 13777927.8 mailed on Feb. 25, 2016.
Bellisai et al. "Single-photon pulsed-light indirect time-of-flight 3D ranging", Optics Express, 21(4): 5086-5098; Feb. 25, 2013.
Office Action of CN Application No. 2013800318802, mailed on Sep. 19, 2016.
Office action of EP patent application No. 13777927.8 issued on Apr. 18, 2017.
Bentell, J. et al. "Flip chipped InGaAs photodiode arrays for grated imaging with eye-safe lasers". Sold-State Sensors, Actuators and Microsystems Conference, Jun. 10-14, 2007. Published Oct. 10, 2007.

120A

| PIXEL OPERATIONAL STEPS (STATES) | RESET & RESET READ | | | GATING (#X LIGHT SOURCE PULSES FOLLOWED BY #X TRANSFERS) | | | | | | | | | | | | | SIGNAL READ | |
|---|---|---|---|---|---|---|---|---|---|---|---|---|---|---|---|---|---|---|
| | A1 | A2 | A3 | A4 | A5 | A6 | A7 | A8 | A9 | A10 | A11 | A12 | A13 | A14 | A15 | A16 | A17 | A18 |
| LIGHT SOURCE PULSE | | | | | | | | | | | | | | | | | | |
| PIXEL SELECT (SEL) | | ▨ | | | | | | | | | | | | | | | ▨ | |
| PIXEL RESET (RST) | | | ▨ | | | | | | | | | | | | | | | |
| PIXEL SAMPLE RESET | | | | ▨ | | | | | | | | | | | | | | |
| PIXEL SAMPLE SIGNAL | | | | | | | | | | | | | | | | | | ▨ |
| TX2 CONTROL (TX2) | | | | | ▨ | | ▨ | | ▨ | | ▨ | | ▨ | | ▨ | | | |
| TX1 CONTROL (TX1) | | | | | | ▨ | | ▨ | | ▨ | | ▨ | | ▨ | | ▨ | | |

| PIXEL OPERATIONAL STEPS (STATES) | RESET & RESET READ | | | GATING (#X LIGHT TRANSFERS) | | | | | | | | | | | | | SIGNAL READ | |
|---|---|---|---|---|---|---|---|---|---|---|---|---|---|---|---|---|---|---|
| | B1 | B2 | B3 | B4 | B5 | B6 | B7 | B8 | B9 | B10 | B11 | B12 | B13 | B14 | B15 | B16 | B17 | B18 |
| PIXEL SELECT (SEL) | ▨ | | | | | | | | | | | | | | | | ▨ | |
| PIXEL RESET (RST) | | ▨ | | | | | | | | | | | | | | | | |
| PIXEL SAMPLE RESET | | | ▨ | | | | | | | | | | | | | | | |
| PIXEL SAMPLE SIGNAL | | | | | | | | | | | | | | | | | | ▨ |
| TX2 CONTROL (TX2) | | | | | ▨ | | ▨ | | ▨ | | ▨ | | ▨ | | ▨ | | | |
| TX1 CONTROL (TX1) | | | | | | ▨ | | ▨ | | ▨ | | ▨ | | ▨ | | ▨ | | |

Figure 4B

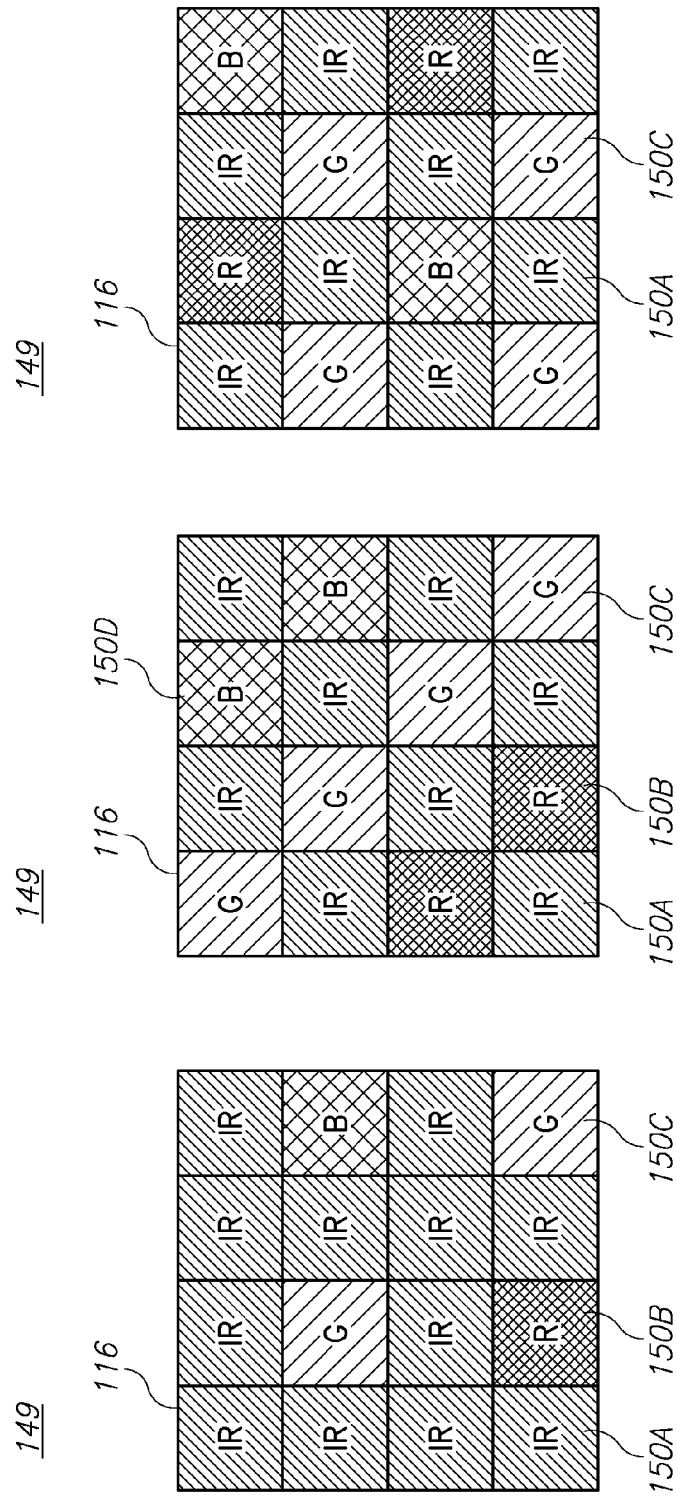

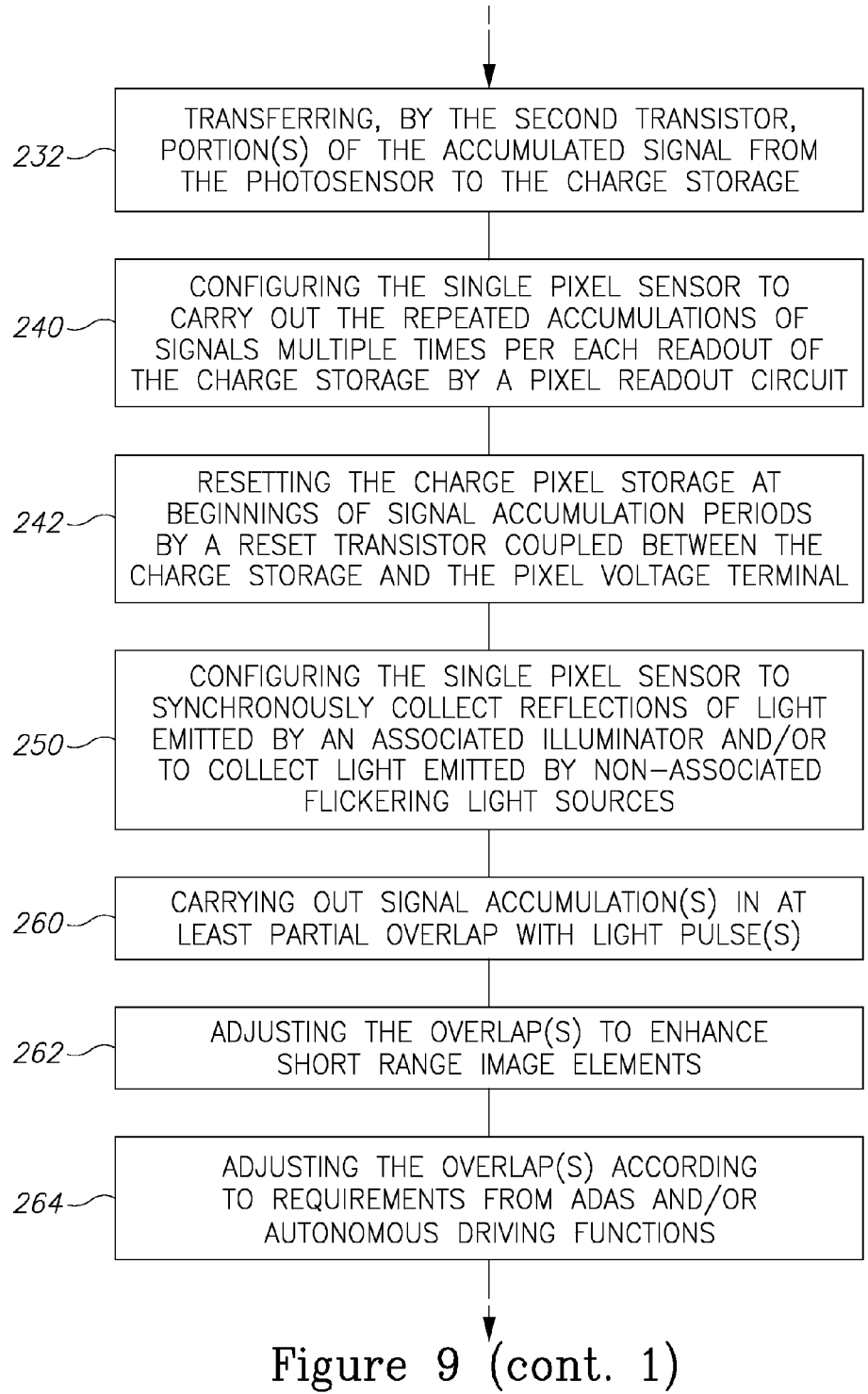
Figure 9 (cont. 1)

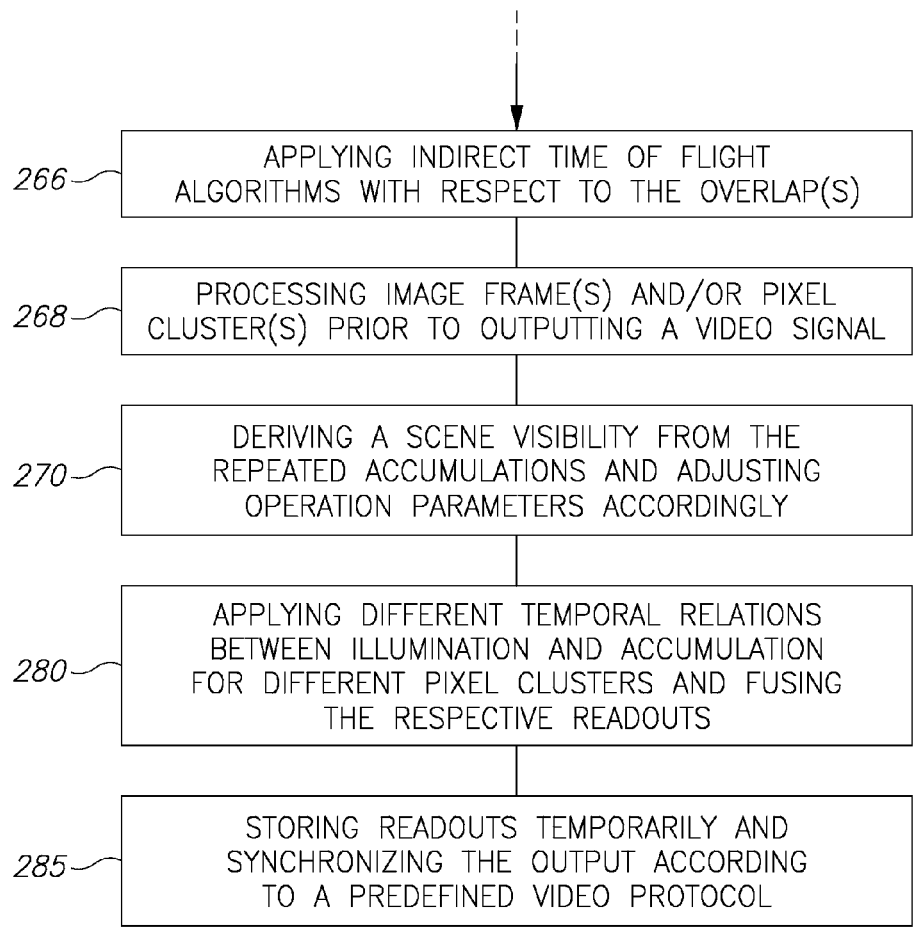
Figure 9 (cont. 2)

CONTROLLABLE GATED SENSOR

CROSS REFERENCE TO RELATED APPLICATIONS

This application is a Continuation In Part of U.S. patent application Ser. No. 15/010,229, filed Jan. 29, 2016, which is a Continuation In Part of U.S. patent application Ser. No. 14/924,878, filed Oct. 28, 2015, which is a Continuation of U.S. patent application Ser. No. 14/700,191, filed Apr. 30, 2015, which is a Continuation of U.S. patent application Ser. No. 14/394,576, filed Oct. 15, 2014, which is a National Phase Application of PCT International Application No. PCT/IL2013/050331, International Filing Date Apr. 17, 2013, claiming priority of U.S. Provisional Patent Application No. 61/625,756, filed Apr. 18, 2012 which is hereby incorporated in its entirety.

BACKGROUND OF THE INVENTION

1. Technical Field

The present invention relates to the field of imaging and/or ranging systems and, more particularly, to active and non-active imaging systems with controllable gated single pixel sensor and image sensor.

2. Discussion of Related Art

U.S. Patent Application Publication No. 2011/0080500, which is incorporated herein by reference in its entirety, discloses an indicia reading terminal having an image sensor pixel array incorporated therein, where the terminal is operative for decoding of decodable indicia and for providing frames of image data (e.g., color) for storage, display, or transmission.

U.S. Patent Application Publication No. 2015/009375, which is incorporated herein by reference in its entirety, discloses an imaging system having an array of image pixels in which each image pixel includes an electronic shutter for controlling when a photosensor in the image pixel accumulates charge.

U.S. Patent Application Publication No. 2015/0156387, which is incorporated herein by reference in its entirety, discloses an image sensor including an imaging element that generates a pixel signal through photoelectric conversion with a variable exposure time; and an accumulation unit that accumulates the pixel signal generated by the imaging element, in which the imaging element repeatedly generates the pixel signal through the photoelectric conversion for each of the divided exposure time periods obtained by dividing a necessary exposure time which is necessary for imaging an image into multiple time periods at intervals of a predetermined time within an imaging time of one frame image, and the accumulation unit accumulates the pixel signal generated by the imaging element and outputs the pixel signal accumulated in the necessary exposure time.

Bellisai et al. 2013, Single-photon pulsed-light indirect time-of-flight 3D ranging, Optics Express 21(4): 5086-5098, teach an indirect time-of-flight imaging camera based on pulsed-light active illumination and a 32×32 single-photon avalanche diode (SPAD) array with an improved illumination timing pattern, able to increase depth resolution and to reach single-photon level sensitivity.

U.S. Pat. No. 6,057,909, which is incorporated herein by reference in its entirety, discloses an apparatus for creating an image indicating distances to objects in a scene, comprising: a modulated source of radiation, having a first modulation function, which directs radiation toward a scene; a detector, which detects radiation reflected from the scene, modulated by a second modulation function, and generates, responsive to said detected modulated radiation, signals responsive to the distance to regions of the scene; a processor, which receives signals from the detector and forms an image, based on the signals, having an intensity value distribution indicative of the distance of objects from the apparatus; and a controller, which varies at least one of the first and second modulation functions, responsive to the intensity value distribution of the image formed by the processor.

U.S. Patent Application Publication No. 2013/0181119, which is incorporated herein by reference in its entirety, discloses a time of flight pixel which includes a photodiode that accumulates charge in response to light incident upon the photodiode. A first transfer transistor is couple between the photodiode and a first charge storage device to selectively transfer charge to the first charge storage device from the photodiode. A second transfer transistor coupled between the photodiode and a second charge storage device to selectively transfer charge to the second charge storage device from the photodiode. An enable transistor is coupled between the first charge storage device and a readout node coupled to the second charge storage device to selectively couple the first charge storage device to the readout node. An amplifier transistor having a gate is also coupled to a readout node.

SUMMARY OF THE INVENTION

The following is a simplified summary providing an initial understanding of the invention. The summary does not necessarily identify key elements nor limit the scope of the invention, but merely serves as an introduction to the following description.

One aspect of the present invention provides a single pixel sensor comprising a photosensor configured to convert light into proportional signals; a charge storage configured to accumulate, repeatedly, a plurality of the signals converted by the photosensor; a first transistor coupled between a pixel voltage terminal and the photosensor; a second transistor coupled between the photosensor and the charge storage; and a readout circuit coupled between the charge storage and an output channel, wherein the single pixel sensor is configured to carry out the repeated accumulations of signals multiple times per each readout by the readout circuit, to synchronously convert reflections of light emitted by the illuminator, and wherein the single pixel sensor is further configured to carry out at least one of the repeated accumulations of signals in at least partial overlap with at least one light pulse generated by the pulsed illuminator.

Another aspect of the present invention provides an image sensor consisting multiple pixel sensors comprising within at least one pixel sensor a photo sensor configured to convert light into proportional signals; a charge storage configured to accumulate, repeatedly, a plurality of the signals converted by the photosensor; a first transistor coupled between a pixel voltage terminal and the photosensor; a second transistor coupled between the photosensor and the charge storage; and a readout circuit coupled between the charge storage and an output channel, wherein the single pixel sensor is configured to carry out the repeated accumulations of signals multiple times per each readout by the readout circuit, to synchronously convert reflections of light emitted by the illuminator, and wherein the single pixel sensor is further configured to carry out at least one of the repeated accumulations of signals in at least partial overlap with at least one light pulse generated by the pulsed illuminator.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings:

FIGS. 4A and 4B are high level schematic tables that illustrate the flow of operation of the single pixel sensor within the pixel array, for active and non-active gating systems, respectively, according to some embodiments of the invention.

FIGS. 7B-7E are high level schematic exemplary illustrations of filter patterns, according to some embodiments of the invention.

DETAILED DESCRIPTION OF THE INVENTION

Figure 1A:
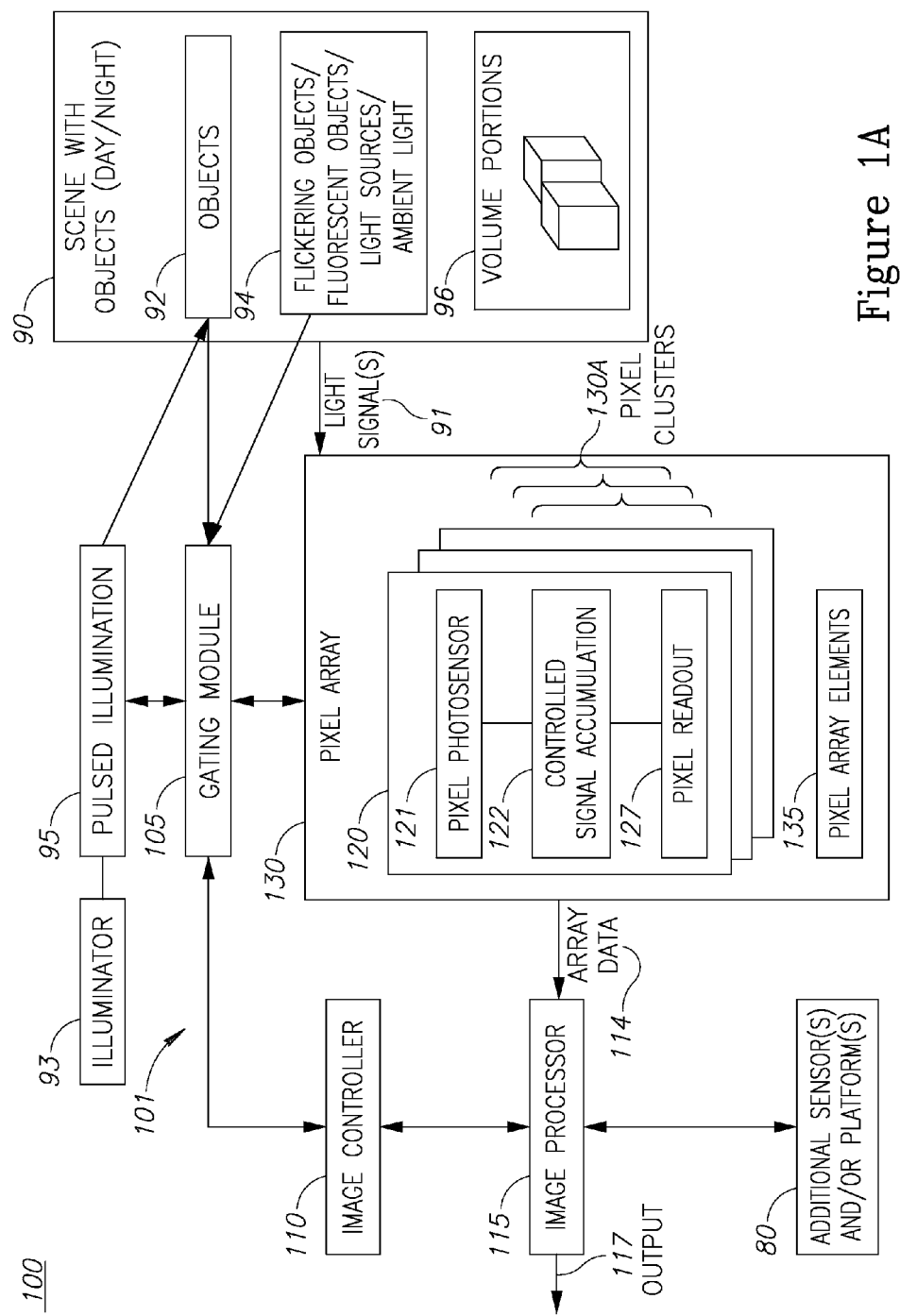
FIGS. 1A and 2A are high level schematic illustrations of a system having an imaging unit with a pixel array, and flow through a single pixel sensor, respectively, according to some embodiments of the invention.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways. Also, it is to be understood that the phraseology and terminology employed herein is for the purpose of description and should not be regarded as limiting.

Figure 1B:
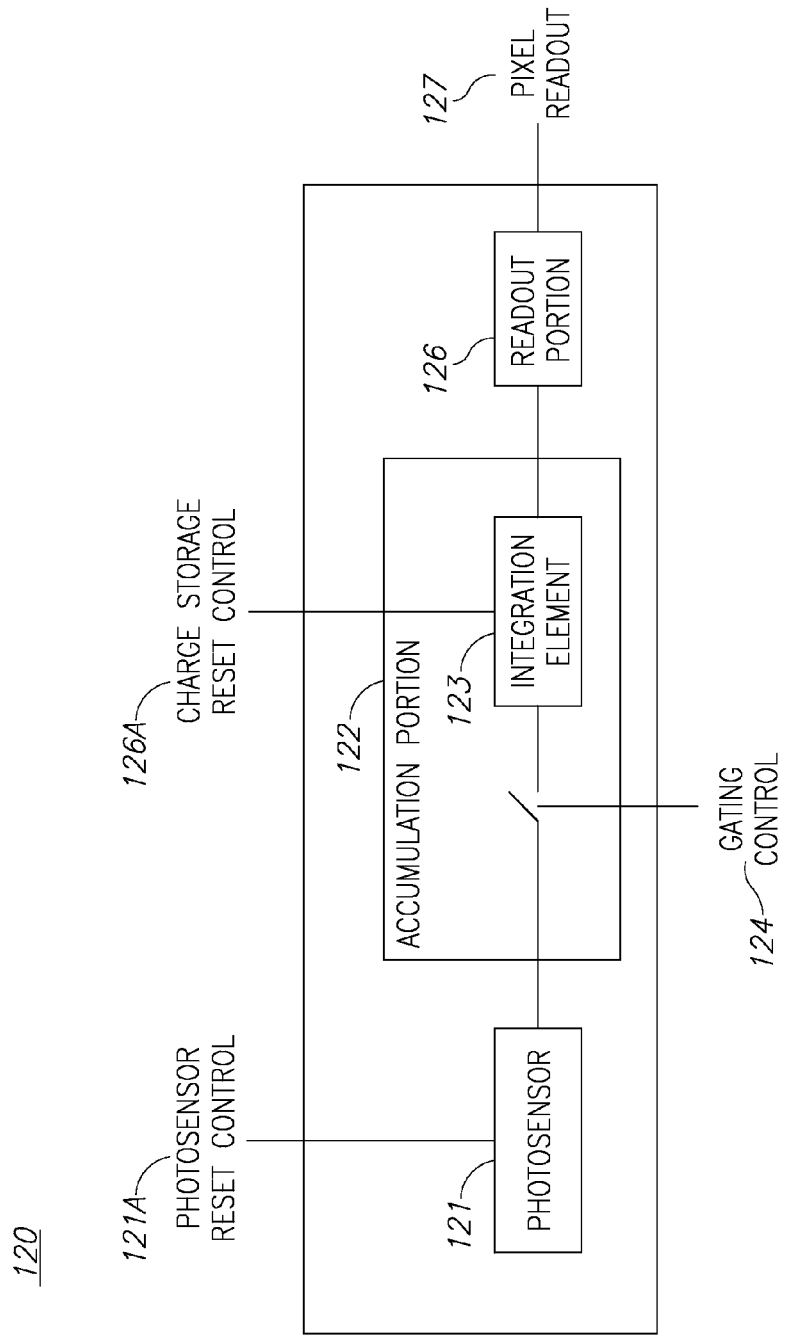
FIGS. 1B and 2B are high level schematic illustrations of the single pixel sensor, according to some embodiments of the invention.
Figure 2A:
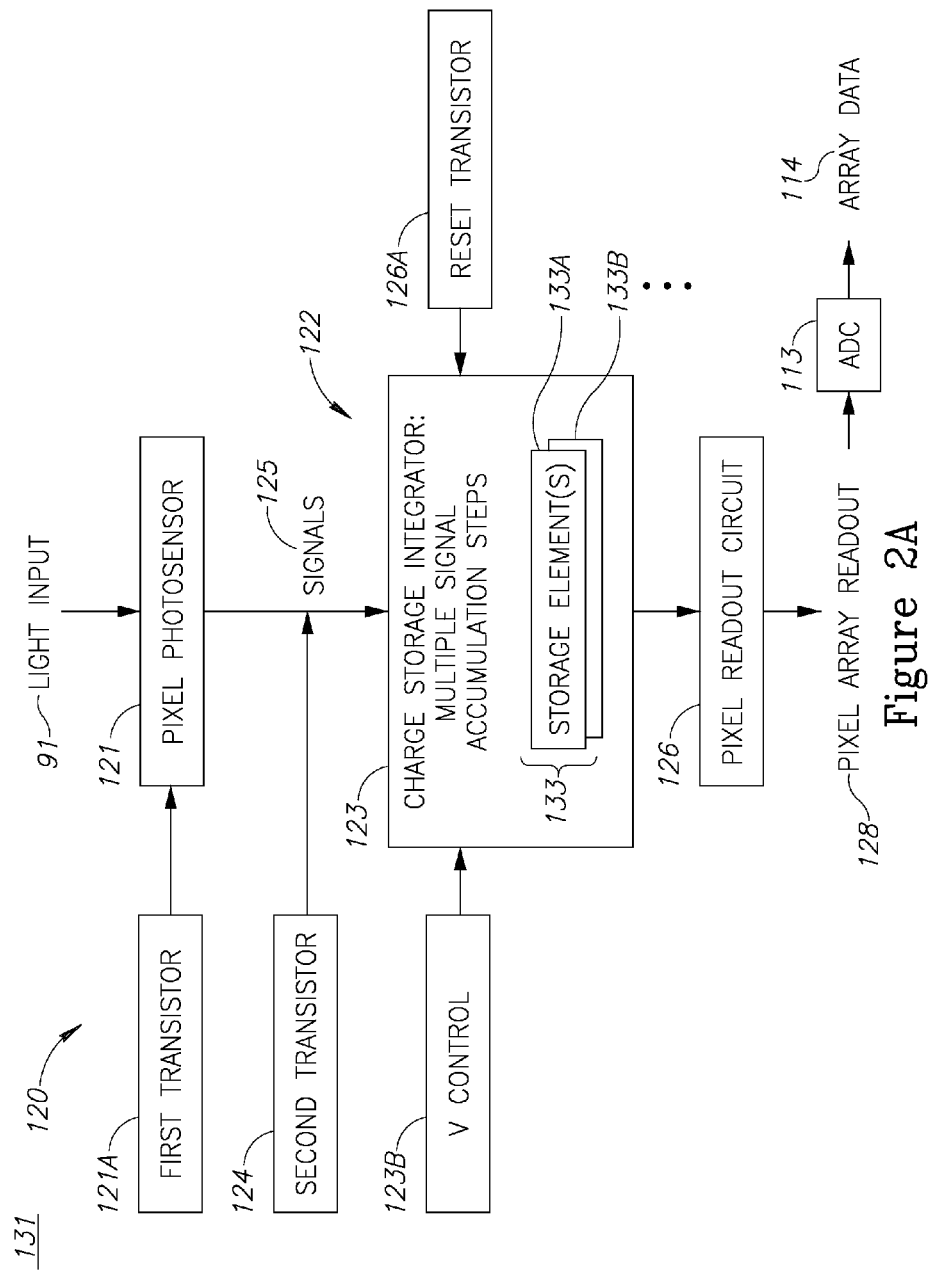
Figure 2B:
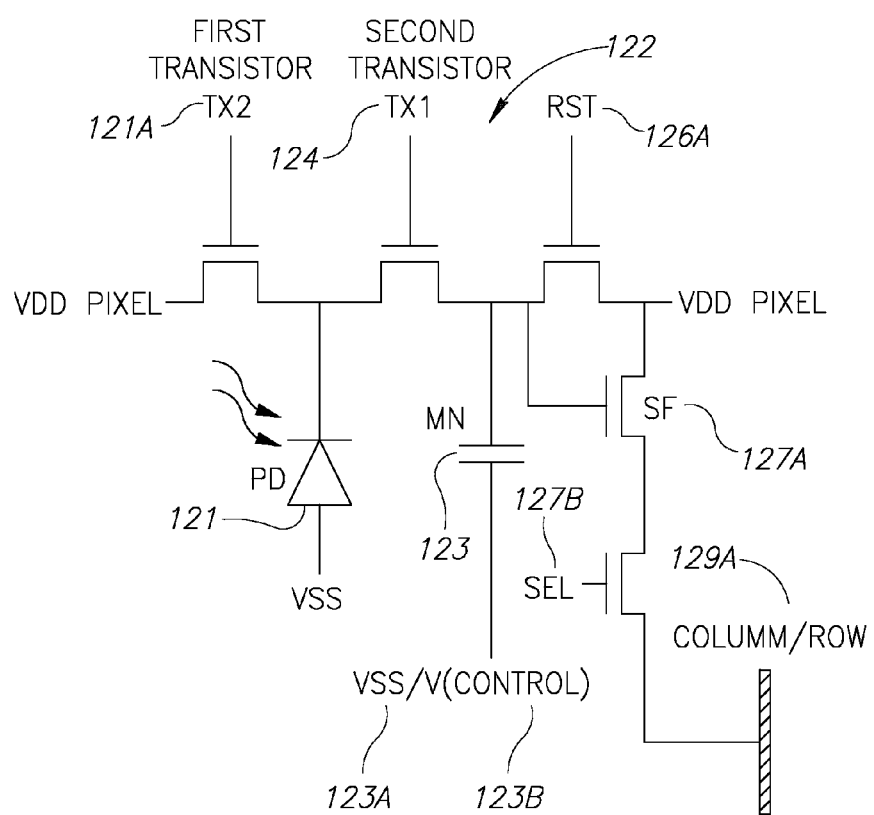

FIGS. 1A and 2A are high level schematic illustrations of a system 100 having an imaging unit 101 with a pixel array 130, and flow through a single pixel sensor 120, respectively, according to some embodiments of the invention. FIGS. 1B and 2B are high level schematic illustrations of single pixel sensor 120, according to some embodiments of the invention.

System 100 may implement non-active and/or active imaging of a scene 90 with objects, at day, at night and/or during inclement weather (see e.g., FIG. 1A). Non-active imaging may comprise detection of light that is not originated by system 100 such as ambient light originating from artificial sources (e.g., flickering LEDs, street lighting, vehicle headlights, etc.) and natural sources (e.g., sun, moonlight etc.). Active imaging may comprise detection of reflections of light emitted by one or more light source(s) that are part of system 100. System 100 may operate in active imaging in a non-gated mode and/or operate in active imaging with in a gated mode. In the non-gated mode the light source may be continuous (for example, have a constant intensity or be modulated as the function of time, e.g., be similar to a sinus waveform) and in the gated mode the light source may be pulsed or partially pulsed. Objects 92 may be reflective (e.g., diffusive, specular, retro-reflector or a combination of these) while objects 94 may be transmitting (emitting) light in a flickering means (e.g., flickering LEDs, light emitting diodes, on road signs, on vehicle taillights, etc.) and may operate in Pulse Width Modulation (PWM). Imaging unit 101 of system 100 may comprise one or more single pixel sensor 120 and/or one or more pixel array(s) 130, optical assembly (not illustrated), electrical imaging unit assembly (not illustrated) and a mechanical housing (not illustrated). Any of the light sources listed above may provide light signals 91 to system 100.

In case of active system 100 in gated mode, pulsed illumination 95 may be projected on scene 90 and a gating module 105 may be used to synchronize at least one single pixel array 130 (e.g., comprising multiple single pixel sensor 120), one or more pixel clusters 130A in array 130 and/or one or more single pixel sensors 120 with pulsed illumination 95 to define one or more specific volume portions 96 of scene 90 by distances from imaging unit 101 as explained below. Multiple volume portions 96 may be defined in scene 90 with respect to their distances from illumination source 95, e.g., volume portions 96 may be defined by starting and ending distance from illumination source 95 or just by one thereof (e.g., $R_{min}$ and/or $R_{max}$), as well as by tangential and angular parameters (e.g., angular expansion tangentially to the radius from illumination source 95). In case of non-active system 100 that images flickering objects 94, gating module 105 may be used to synchronize single pixel array(s) 130, single pixel clusters(s) 130A and/or single pixel sensor(s) 120 with the flickering of flickering objects 94 as identified by system 100 e.g., in past images by an image processor 115 and an image controller 115 or by additional sensor(s) and/or platform(s) 80. Flickering objects 94 may be identified automatically and/or system 100 may have a default mode of collecting light signals 91 from flickering objects 94. In certain embodiments, system 100 may be configured to synchronize to flickering objects 94 automatically and/or as a default mode. Alternatively or complementary, ambient light 94 and/or reflections thereof may also be captured in a non-gated manner, such as by applying a single exposure per each single image readout process, or in gated manner by gating module 105. Light signals 91 from scene 90 are captured by pixel array 130 as explained below, by multiple single pixel sensors 120 (each receiving a light input 91), each comprising a pixel photosensor 121 (such as a photodiode), a controlled signal accumulation function 122 and a pixel readout 127. Image data from single pixel sensor(s) 120 is used via pixel array 130 by image processor 115 to derive images and/or image information related to scene 90, which may then be integrated from image or other data from by additional sensor(s) and/or platform(s) 80 and/or be used by image controller 110 to modify or adjust future image capturing by pixel array 130, pixel clusters 130A and/or single pixel sensor 120. Pixel array 130 may further comprise pixel array elements 135 such as a pixel array readout (i.e., a readout of pixel array 130), pixel array power supply(s), a pixel array timing control and a pixel array image processing unit. Pixel array 130 provides images to image processor 115, which, after further processing are delivered as output 117 of system 100.

In certain embodiment, objects 94 may be a transmitting (emitting) light in a pulsed mode, for example randomly or at fixed frequency. In certain embodiment, objects 94 may be florescent, and system 100 may be utilized to collect and convert the fluorescent emission in multiple exposures, as explained below. For example, system 100 may be applied in medical imaging of samples with fluorescent markers. The accumulated signal may be used to provide highly sensitive fluorescent images of such samples.

High level operation 131 of single pixel sensor(s) 120, which may be backside illuminated sensor(s) (see FIG. 6), within pixel array 130 is illustrated e.g., in FIG. 2A. Single pixel sensor 120 receives light input 91 and delivers a converted signal to pixel array readout 128. Single pixel sensor 120 comprises photosensor 121 configured to convert light signals 91 into proportional signals 125 and a charge storage integrator 123 configured to accumulate, repeatedly, multiple signals 125 converted by photosensor 121 from corresponding light 91. Photosensor 121 may be a single element or be divided to multiple elements with identical or different conversion capability within pixel 120. Charge storage integrator 123 (denoted below also as memory node—MN, or as floating diffusion—FD) may be a single storage element or be divided to multiple storage elements with identical or different storage capacities within pixel 120.

Charge storage integrator 123 may comprise multiple storage elements 133 that may be configured to provide different dynamic ranges, e.g., based on different storage capacities. Charge storage integrator 123 with multiple storage elements 133 may be configured to provide different signal accumulation with respect to different volume portions 96 and/or different objects 92, 94 in scene 90. For example, a first storage element 133A in charge storage integrator 123 may be configured to provide signal(s) of flickering objects 94 and a second storage element 133B may be configured to provide signal(s) of volume portions 96. Alternatively or complementarily, first storage element 133A may be configured to provide signal(s) of ambient light 94 and second storage element 133B may be configured to provide signal(s) of flickering objects 94. Alternatively or complementarily, first storage element 133A may be configured to provide signal(s) of objects 92 and second storage element 133B may be configured to provide signal(s) of volume portions 96. Multiple storage elements 133 may be arranged to provide signal(s) relating to any combination and types of objects and volume portions in scene 90.

Charge storage integrator 123, as part of controlled signal accumulation function 122, may go through one or more signal accumulation step(s) as controlled by the following components (see more details below): a first transistor 121A coupled between a pixel voltage terminal and photosensor 121; a second transistor 124 coupled between photosensor 121 and charge storage 123; and a pixel readout circuit 126 coupled between charge storage 123 and an output channel to provide a pixel array readout 128. In particular, single pixel sensor 120 is configured to carry out the repeated accumulations of signals 125 multiple times per single readout by readout circuit 126 and to synchronously collect and convert reflections of light emitted (95) by an associated illuminator 93 or to collect and convert light emitted by non-associated flickering objects/ambient light 94. Single pixel sensor 120 may further comprise a reset transistor 126A coupled between charge storage 123 and the pixel voltage terminal and configured to reset charge pixel storage 123 at beginnings of signal accumulation periods and/or during signal accumulation. It is noted that pixel array readout 128 may comprise only some of the individual pixel readouts 127, e.g., in certain modes pixel array readout 128 may comprise only some of the rows or columns (e.g., every second or third row/column for scanning), pixel array readout 128 may comprise only pixel readouts 127 that show a difference from a previous readout in time (earlier readouts) or space (adjacent or other pixels 120, e.g., in other columns/rows). Pixel signal in pixel array readout 128 is converted from analog to digital by an A/D (analog to digital) converter 113 and output as array data 114.

FIG. 1B schematically illustrates conceptual configurations of single pixel sensor 120, comprising a photosensor 121 connected via a gating control 124 to an integration element 123. Gating control 124 and integration element 123 are parts of an accumulation portion 122. The accumulated signal is then delivered to a readout portion 126 which provides pixel readout 127. Photosensor 121, accumulation portion 122 and integration element 123 may be reset by corresponding controls 121A and 126A. Photosensor 121 outputs a signal indicative of an intensity of incident light. Photosensor 121 is reset by inputting the appropriate photosensor reset control signal. Photosensor 121 may be any of the following types: photodiodes, photogates, metal-oxide semiconductor (MOS) capacitors, positive-intrinsic-negative (PIN) photodiodes, pinned photodiodes, avalanche photodiodes, visible range to short wave infrared range (SWIR) photodiodes (incorporating, e.g., any of silicon, germanium, indium gallium arsenide, indium aluminum arsenide, indium phosphide, lead sulfide, mercury cadmium telluride, etc.) or any other suitable photosensitive element. Some types of photosensors may require changes in the pixel structure and/or processing methods (for example for a hybrid structure using indium bumps). Accumulation portion 122 performs gated accumulation (i.e., accumulates intervals of sub-exposures prior to the signal readout) of the photosensor output signal over a sequence of time intervals. The accumulated output level may be reset by inputting a pixel reset signal into accumulation portion 122 by reset transistor 126A. The timing of the accumulation time intervals may be controlled by a gating control signal, described below, that may be controlled externally (outside pixel array 130), internally (within pixel array 130) or partially externally and partially internally.

First transistor (TX2) 121A, coupled between pixel voltage terminal (denoted VDD pixel for drain voltage), and photo sensor 121 may be configured to control a resetting of photosensor 121 and second transistor (TX1) 124, coupled between photosensor 121 and charge storage 123, may be configured to control a transfer of the accumulated signal (125) to charge storage 123. For example, first transistor (TX2) 121A may be configured to reset photosensor 121 prior to each signal accumulation period and second transistor (TX1) 124 may be configured to transfer at least a portion of the accumulated signal (125) from photosensor 121 to the charge storage 123. First transistor (TX2) 121A may be further configured to prevent blooming of photosensor 121 by resetting photosensor 121 and/or by setting the low voltage threshold of first transistor (TX2) 121A to a higher value upon detection of signal leakage from adjacent pixel sensors (similar to 120, not shown). For example, in a nominal operation mode the voltages of first transistor (TX2) 121A may be 5V (high state) and 0V (low state) while in a blooming operation mode the voltages of first transistor (TX2) 121A may be 5V (high state) and 1V (low state). Reset transistor (RST) 126A coupled between charge storage 123 and the pixel voltage terminal (VDD pixel) is typically configured to reset charge pixel storage 123 at beginnings of signal accumulation periods. Single pixel sensor 120 may further comprise a voltage controlling element 123B (denoted V control, providing an anti-blooming mechanism similar to TX2 transistor 121A as described above) connected to charge storage 123 and configured to determine a signal level in charge storage 123 and reduce overflow of charge storage 123 to reduce blooming of adjacent pixels 120, as explained below. Alternatively, charge storage 123 may be connected to the same voltage 123A (denoted VSS for source voltage) as photosensor 121. The accumulated output level may be reset by inputting a pixel reset signal into readout portion 126 (not illustrated).

FIG. 2B schematically illustrates pixel sensor 120, according to some embodiments of the invention. FIG. 2B is a non-limiting example for the design illustrated in FIG. 1B. In certain embodiments, pixel sensor 120 may be implemented by complementary metal oxide semiconductor (CMOS) standard fabrication technology (e.g., with operating voltage: 1.8/3.3V and 1.8/5V on the 0.18 μm platform or 1.2/3.3V on the 65 nm platform) or any other manufacturing process. Each pulse of light is converted to a proportional electrical signal by the Photo-Diode (PD) 121 that may be a pinned PD 121 (as an example for photosensor 121 in FIG. 1B). The generated electrical signal from the PD is transferred by an electric field to the FD/MN 123 which acts as an integrator 122 (i.e., a capacitor) accumulating each converted pulse of light (as an example for accumulation portion 122 in FIG. 1B). Two controllable pixel signals generate the pixel-gating manner (sub-exposure mechanism) the transfer gate transistor (TX1) 124 (as an example for gating control 124 in FIG. 1B) and the anti-blooming transistor (TX2) 121A (as an example for reset control 121A in FIG. 1B). The anti-blooming transistor has three main objectives; the first being part of the single light pulse gating mechanism when coupled to TX1 (i.e., TX2 is turned from ON to OFF or TX2 is turned from OFF to ON), the second preventing undesired parasitic signal generated in the PD not to be accumulated in the PD during the time TX1 is OFF (i.e., PD Reset) and the third to channel excessive electrical signal originated in the PD when TX1 is ON, hence the role of anti-blooming. Anti-blooming TX2 controllable signal acts as an optical shutter which ends the single accumulated light pulse. Transfer gate transistor (TX1) 124 is turned ON only in a desired time and only for a desired duration which is coupled to TX2 121A. Once all pulses of light were accumulated in the FD/MN 123, the signal is readout to provide a single image frame.

Multiple gated low noise pixel sensor 120 may have a standard electric signal chain after the "gate-able" configuration of PD 121, TX1 124, TX2 121A and FD/MN 123. This standard electric signal chain may consist of a Reset transistor (RST) 126A (as an example for FD/MN reset control 126A in FIG. 1B) with the role of charging FD/MN 123 with electrical charge using the pixel voltage (VDD) or other voltage span, may consist of a Source Follower (SF) transistor 127A converting the accumulated signal (i.e., electrons) to voltage and may consist of a Select (SEL) transistor 127B connected to the column and/or row 129A for a pixel array.

This schematic circuit diagram depicting pixel sensor 120 having a minimal number of five transistors ("5 T") and at least one charge storage integrator 123. This pixel configuration may operate in a multiple exposure mechanism per a single image readout as described above. In addition this pixel may also operate in a standard 5 T pixel timing sequence (such as global shutter pixel as presented in FIG. 4C below or rolling shutter pixel, not illustrated) or operate in a standard 4 T pixel timing sequence. This versatile operating configuration (i.e., gating sequence or standard 5 T or standard 4 T) enables to operate the pixel under different lighting conditions. For example, gating timing sequence during low light level in active gated mode (with pulsed illumination), 4 T timing sequence during low light level during nighttime (without system illumination, hence using ambient light sources) and 5 T timing sequence during high light level during daytime. This schematic circuit diagram depicting pixel sensor 120 may also have additional circuits for internal Correlated Double Sampling (CDS) and/or for High Dynamic Range (HDR) as reflected in FIG. 1A in pixel array elements 135. Adding such additional circuits reduces the photo-sensing fill factor (i.e., sensitivity of the pixel). Pixel 120 may be fabricated with a standard epitaxial layer (e.g., 5 μm, 12 μm), higher epitaxial layer (e.g., larger than 12 μm) or a processed epitaxial layer that has been processed to extend the Quantum Efficiency (QE). In addition, epitaxial layer may have a standard resistivity (e.g., a few ohms) or high resistivity (e.g., a few kilo-ohms).

In active gated imaging eye and skin safety standards may limit the light source (e.g., laser, LED etc.) optical peak power, optical average power, etc. Noise in gate (second) transistor (TX1 124) resulting from the transistor's transfer efficiency that is related to the physical procedures and uncertainty level of the electrical charge transfer, may be a crucial parameter in such a case. At least three different methods may be implemented in the pixel to provide a higher gate transfer (TX1) efficiency: (i) Setting a high potential voltage between photosensor 121 to charge storage 123 enabling an intense electrical field causing electrical charge carriers (i.e., at least a single electron) to have a higher probability to be "pulled" to charge storage 123 (FD), e.g., by setting an appropriate TX1 high level. For example, in a nominal operation mode the voltages of second transistor (TX1) 124 may be 3V (high state) and 0V (low state) while in high efficiency transfer (i.e. low signal transfer) operation mode the voltages of the first transistor (TX2) 121A may be 5V (high state) and 0V (low state). (ii)

Adjusting the physical dimensions of the transfer gate, mainly on the TX1 124 and PD 121 side. The larger the transfer gate (TX1 124), the larger is the gate transfer efficiency to charge storage 123 (FD) and vice versa. (iii) Adjusting the physical structure of the transfer gate, mainly on the TX1 124 and PD 121 side. The fewer flaws (e.g., holes) are in the transfer gate (TX1 124), the larger is the gate transfer efficiency to charge storage 123 (FD) and vice versa.

During the period when a camera sensor is not exposed (i.e., while the light pulse may still be propagating through the atmosphere), the sensor ideally does not accumulate any photons. But in practice, a certain level of residual light may still enter the image sensor or be accumulated by the image sensor (i.e., signal charge can be stored in the memory node without being contaminated by parasitic light). This phenomenon of "leakage photons", which may be referred as Parasitic Light Sensitivity (PLS), is especially problematic in CMOS sensors, where it is difficult to mask the memory node (MN) and floating diffusion in the pixel level sensor (typical masking approaches include: micro-lens focusing light away from the MN, metal layers above the MN, potential attracting the photoelectrons to the photodiode, and potential barriers around the MN). PLS is a function of the overall pixel exposure time and readout time. Pixel sensor 120 exhibits a high PLS value of at least 1000.

Figure 3A:
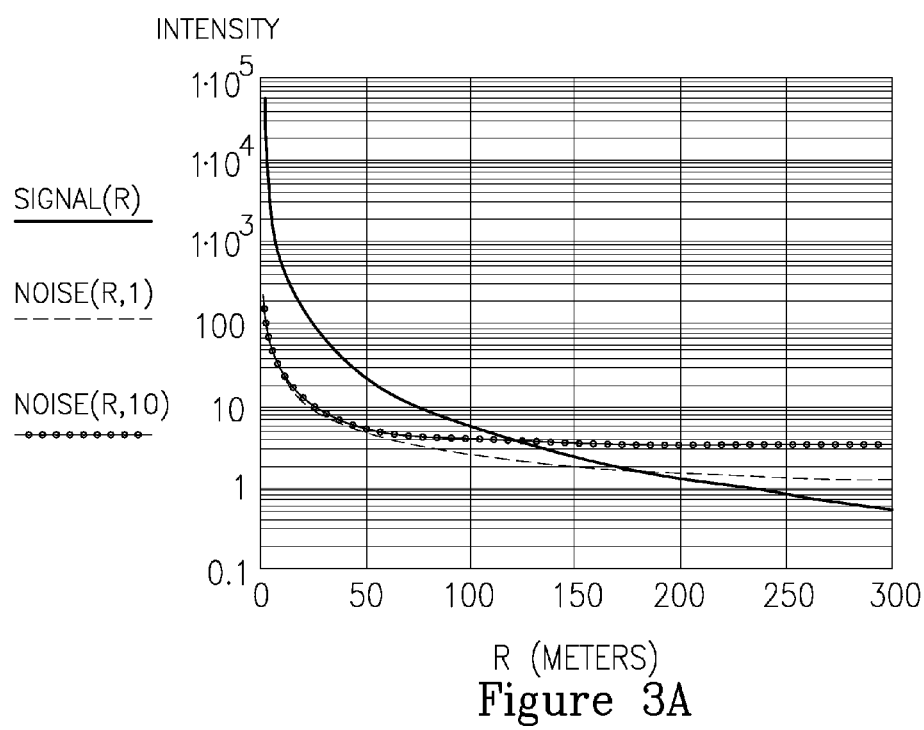
FIGS. 3A and 3B show the results of the simulation, according to some embodiments of the invention.
Figure 3B:
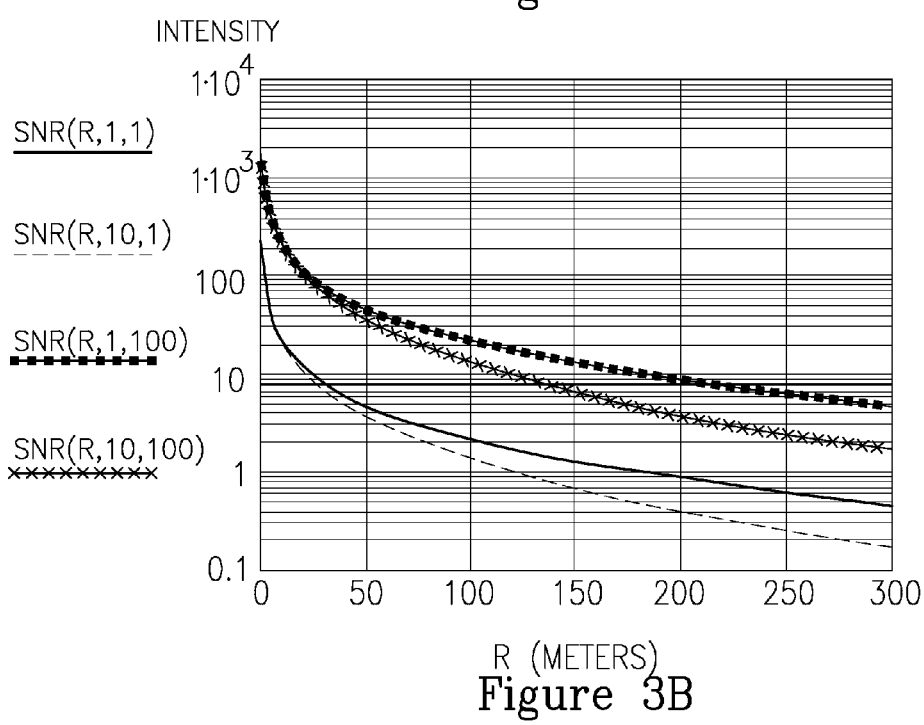

The following presents a simulation of the operation of single pixel sensor 120 in active gated mode, the results of which are shown in FIGS. 3A and 3B below.

The governing parameter of an active imaging performance is the modulation contrast which is defines as "Contrast" in the following Equation 1, taking into account the air light, which is in this context light from ambient light sources that are scattered into the system's FOV and backscatter, which add to the target and background.

$$\text{Contrast} = \frac{I_{Target}^{Total} - I_{Background}^{Total}}{I_{Target}^{Total} + I_{Background}^{Total}} = \frac{I_{Target} - I_{Background}}{I_{Target} + I_{Background} + 2I_{Air} + I_{Backscatter}} \quad \text{Equation 1}$$

with $I_{Target}^{Total} = I_{Target} + I_{Air} + I_{Backscatter}$
and $I_{Background}^{Total} = I_{Background} + I_{Air} + I_{Backscatter}$.

$I_{Air}$ is the air-light contribution to the focal plane illumination. For night vision, there is very little or no air light and $I_{Air} \approx 0$. This result may be achieved using a narrow band pass filter, such as a spectral filter which may correlate to pulsed illumination 95. For harsh weather imaging conditions (e.g., dust, smog or fog), we must take the air-light into account. The following presents a convenient method for predicting the effects of atmospheric backscatter on image quality when an artificial source near the image sensor is used to illuminate a distant scene. It is assumed that the separation between illuminator and imaging system is small compared to the range to the nearest illuminated particles in the FOV. Then, the radiance of the atmosphere within the FOV is calculated by summing the backscatter contributions of all illuminated particles on the path between the sensor and the scene. The result is shown in Equation 2.

$$I_{Backscatter} = \int_{2\gamma R_{min}}^{2\gamma R_{max}} \frac{PG\gamma^2 e^{-x}}{2F_{\#l}^2 \theta_l^2 x^2} dx \quad \text{Equation 2}$$

with the following designations (unit in square parentheses):
$I_{Backscatter}$=Radiance of atmospheric backscatter [Power/area],
$R_{min}$=Range from imaging system (and from illuminator) to the nearest illuminated particles in the field of view [length],
$R_{max}$=Range from imaging system (and from illuminator) to the scene being imaged [length],
P=Radiant intensity of the illuminator [power],
G=Backscatter gain of atmospheric particles relative to isotropic scattering [dimensionless],
$\gamma$=Atmospheric attenuation coefficient or "extinction coefficient" [1/Length],
$F_{\#l}$=F number of the illuminator optics [dimensionless], and
$\theta_l$=Illuminator beam divergence [angle].

With a narrow wavelength illuminator and the line-of-sight path through the atmosphere taken to be horizontal, the atmospheric attenuation coefficient is considered constant. The following are the simulation parameters.

Detector and Optics

GCMOS (gated complementary MOS—metal-oxide-semiconductor) sensor similar to 130 in FIG. 1A; Pixel dimensions d=10 μm; Quantum efficiency times fill factor QE=40%

Sensor F# $F_{num}$=1.2; Transmittance of optics (lens) $T_{optics}$=0.8;

$$\text{Spectral Sensitivity} = \frac{QE \cdot q_{electron} \cdot \lambda}{hc} = 0.258 \text{ amp/watt}$$

Illuminator

Wavelength $\lambda$=800 nm; Light peak power $P_{light}$=500 W, illuminator optical transmission (lens) $\tau_{light}$=0.8; Light divergence (x, y axes) $\theta_{light,x}$=24°, $\theta_{light,y}$=8°; Light/Gate pulse Full Width At Half Maximum (FWHM) $t_{gate}$=10 μs; Range R=1 m, 2 m . . . , 300 m; Number of pulses/gates per single readout N=1, 2, . . . , 1000.

Atmospheric and Target Conditions

Visibility vis=10 km; Target reflectance $r_{target}$=0.3; Attenuation coefficient $$\gamma = -\frac{\ln(0.02)}{Vis} \cdot \left(\frac{\lambda}{0.55 \text{ μm}}\right)^{-1.3} = 0.24 \text{ km}^{-1}$$

The signal is simulated according to Equation 3:

$$\text{Signal}(R) = \left( \frac{\text{Spectral Sensitivity} \cdot \frac{P_{light} \cdot \tau_{light}}{\pi R^2 \cdot \tan\frac{\theta_{light,x}}{2} \cdot \tan\frac{\theta_{light,y}}{2}} \cdot \frac{T_{optics} \cdot r_{target} \cdot e^{-2\gamma R}}{4 F_{num}^2} \cdot t_{gate} \cdot d^2}{I_{Target} + I_{Background} + 2I_{Air} + I_{Backscatter}} \right) \Big/ q_{electron} \quad \text{Equation 3}$$

and the noise and signal to noise ratio (SNR) are derived from the signal as expressed in Equations 4A and 4B, respectively (R is the target's distance, $n_{transfer}$ is the noise transfer in terms of number of electrons, N is the number of light pulses):

Noise per single gate as function of range [electrons] = Equation 4A
$$\text{Noise}(R, n_{transfer}) == \sqrt{\text{Signal}(R) + n_{transfer}}$$

SNR as function of range and pulses per gate = Equation 4B
$$\text{SNR}(R, n_{transfer}, N) == \sqrt{N} \cdot \frac{\text{Signal}(R)}{\text{Noise}(R, n_{transfer})}$$

FIGS. 3A and 3B show the results of the simulation, according to some embodiments of the invention. The following example of a calculation of signal and noise levels illustrates the influence of pixel signal, pixel noise level (only due to gate transfer) (FIG. 3A) and pixel SNR (FIG. 3B). FIG. 3A illustrates the signal's dependency on the target distance (Equation 3) as well as the dependency of the noise level on the target distance (Equation 4A) for a single accumulated signal (i.e., single gate transfer through TX1 124) with noise transfer equal to one and ten electrons. FIG. 3B illustrates the SNR's dependency on the target distance (Equation 4B), SNR (R, $n_{transfer}$, N) with noise transfer ($n_{transfer}$) equal to one and ten electrons, for one and one hundred light pulses (N).

FIGS. 4A and 4B are high level schematic tables that illustrate the flow of operation of single pixel sensor 120 within pixel array 130, for active and non-active gating systems, respectively, according to some embodiments of the invention. FIGS. 4A and 4B schematically exemplify operating modes 120A, 120B, respectively, of pixel 120, according to some embodiments of the invention.

FIG. 4A illustrates a flow table of multiple gated low noise pixel sensor 120 in pixel array 130 timing sequence for an active gated imaging where the pulse that are emitted and then reflected from each light source 95 (such as originating from a laser and/or LED and/or arc light or any other triggered light source of the active gated imaging system) is synchronized to each pixel gate (sub-exposure) event per a single readout. The timing sequence is illustrated schematically (not to scale) by steps (from left to right, A1 to A18) that indicate variable periods of time with ON signals indicated as full cells. Source Follower (SF) 127A is part of the pixel readout channel and is not described herein below. The following steps are illustrated:

Step A1: Pixel select transistor (SEL 127B) is ON, providing the specific row array selection from the array rows, and second, pixel anti-blooming transistor 121 (TX2) is ON, with VSS voltage level lower than VDD, preventing undesired parasitic signal generated in PD 121 from being accumulated in PD 121.

Step A2: Pixel reset transistor (RST) 126A is ON to fully deploy charge storage (MN/FD) 123 with charge and pixel anti-blooming (TX2) is ON preventing accumulation of undesired parasitic signal in PD 121.

Step A3: Pixel reset signal is sampled via the readout channel providing the pixel FD signal level prior accumulation of at least a single desired exposure (i.e. gate). The pixel reset signal may be subtracted from the pixel signal sample in step A18 to eliminate the offset signal (hence CDS, correlated double sampling, which is done externally to the pixel in a gated configuration as illustrated in FIG. 2B). pixel anti-blooming (TX2) is ON preventing accumulation of undesired parasitic signal in PD 121. Reset and reset read (steps A1-A3) for a specific signal readout may be carried out before or after the multiple exposures and signal readout (steps A4-A18).

Step A4: Pulse of light 91 is generated as part of the active gated imaging and anti-blooming (TX2 121A) is ON to prevent accumulation of undesired parasitic signal generated in PD 121.

Step A5: The pulse of light (part of the active gated imaging) propagates to a desired distance and is reflected back to the pixel and anti-blooming (TX2) 121A is turned OFF providing the beginning of signal 125 generated (converted) in PD 121 to be transferred via transfer gate transistor (TX1) 124.

Step A6: Pixel transfer transistor (TX1) 124 is turned ON to transfer electrical signal 125 generated in PD 121 to charge storage 123 (MN/FD) followed by anti-blooming (TX2) 121A turned back ON ending the single gate transfer event and preventing accumulation of undesired parasitic signal generated in PD 121. TX1 ON period may be equal, longer or shorter than the light pulse time to accumulate the desired pulse reflected signal and to reduce background signal accumulation.

Step A7: Pixel transfer transistor (TX1) 124 is OFF with and anti-blooming (TX2) 121A is ON to prevent accumulation of undesired parasitic signal generated in PD 121.

Step A8: Similar to Step A4 but may have a different duration than in Step A4. For example, the duration of Step A4 may be 1 μsec (Full Width Half Maximum) while the duration of Step A8 may be 0.5 μsec or 1.5 μsec, in non-limiting examples.

Step A9: Similar to Step A5 but may have a different duration than Step A5 to provide a different accumulation starting distance in the pixel FOV. For example, the duration of Step A5 may be 1 μsec (e.g., equal to a starting distance of about 150 m for light propagation in free space) while the duration of Step A9 may be 0.5 μsec (e.g., equal to a starting distance of about 75 m for light propagation in free space).

Step A10: Similar to Step A6 but may have a different duration than Step A6 to accumulate a light source pulse duration in Step A10 (equal, longer or shorter than the light pulse time). The time provides a different accumulation for different depths of field distance(s) in the pixel FOV. For example, the duration of Step A6 may be 1 μsec (e.g., equal to depths of field of about 150 m for light propagation in free space) while the duration of step A10 may be 0.6 μsec (e.g., equal to depths of field of about 90 m for light propagation in free space).

Step A11: Similar to Step A7 but may have a different duration than Step A7.

Step A12-Step A15: Similar to Step A4-Step A7 and to Step A8-Step A11 but may have different durations as indicated above. The pixel gate (light exposure and accumulation) may be conducted once, twice or any number of gates (sub-exposures) per pixel readout (#X).

Step A16: After at least a single gate transfer event, anti-blooming (TX2) 121A may be ON to prevent accumulation of undesired parasitic signal generated in PD 121.

Step A17-Step A18: Standard pixel readout (Signal read) is provided. While anti-blooming (TX2) 121A is ON to prevent accumulation of undesired parasitic signal generated in PD 121 and in FD 123, pixel select transistor (SEL) 127B is ON and the accumulated pixel signal is readout from FD 123 via the Source Follower (SF) transistor 127A and the Select (SEL) transistor 127B.

In active gated imaging with array 130 of multiple gated low noise pixels 120 per a single readout, the timing sequence of gate transistor (TX1) 124 and anti-blooming transistor (TX2) 121A of during Step A5 and Step A6 may vary from pixel 120 to pixel 120 or from one pixel array cluster 130A to another pixel array cluster 130A. This enables each pixel 120 or pixel array cluster 130A to accumulate different depths of field distance and/or starting distance in the pixel FOV.

Gating module 105 may be further configured to simultaneously gate at least two pixel clusters 130A with different gating parameters by independently controlling the respective transfer gate transistors of the respective pixels of the at least two pixel clusters 130A. In addition, the different gating parameters may include synchronization parameters with regard to one or more light source 95, to match a different scenery volumes 96 for different pixel clusters 130A (the scenery volume is defined as volume portion 96 in scene 90 that is defined by borders such as different depths of field distance and/or starting distance in the pixel FOV).

The ability to conduct a direct TOF (time of flight) imaging with a synchronized source of light reflected back to the multiple gated pixel FOV may also be achieved by several methods such as performing Steps A1-A7 and rather than performing Step A8 perform several times a sequence of Steps A6-A7 with a short delay of $\Delta T$ between each sequence. Each delay of $\Delta T$ accumulates a different portion of the depths-of-field of $\Delta Z = \Delta T * C/2$, where C is the speed of light. For example a delay of $\Delta T = 100$ nsec between sequences of Step A6-A7 shall provide a depths-of-field of 15 m for each sequence.

FIG. 4B illustrates a flow table of the multiple gated low noise pixel array timing sequence for a non-active gated imaging where pixel gate timing may be synchronized or unsynchronized to an external light source 94 (originating from a laser and/or LED and/or arc light or any other triggered light source not part of the gated imaging system but is located in the gated imaging system FOV) for example a traffic sign flickering light source. In contrast to active gated imaging timing described above (FIG. 4A), non-active gated imaging timing of each gate (i.e., pixel sub-exposure to light which is a function of TX1 124 and TX2 121A) may not be synchronized with the pulse light source. The multiple gates (i.e., sub-exposures) with different timings provide the adequate light source signal level with respect to the background signal in a single pixel readout 127. Prior art imaging systems (e.g., global shutter or rolling shutter image sensors) of flickering light sources 94 may suffer in a single image frame from image artifacts, for example, color artifacts, missing parts of an object, and object distortion. Such imaging system (which operate only with a single exposure time per a single image frame) try to resolve these image artifacts by controlling the image sensors' different exposure time and may try to integrate and fuse multiple image frames. For example, a single long exposure time may try to resolve the image artifacts by collecting all the flickering light source information. However, as the imaged scene may include high signal levels (e.g., during daytime, capturing low or high oncoming headlamps, capturing the sun etc.) which require prior art imaging systems to have a short exposure time, such prior art systems cannot resolve this conflict. Back to pixel sensor 120 of the proposed method—instead of having a single exposure per single signal readout the exposure is divided to multiple gates (sub-exposures) in order to collect the flickering signal originating from flickering objects 94 and avoid collecting ambient light during the off periods (i.e., between sub-exposures). The signal (or image frame) duration thus consists of the sub-exposures without intervening ambient strong light sources. The timing sequence is illustrated (not to scale) by steps (from left to right, steps B1-B18), where each step indicates a period of time and a signal ON is indicated in a full cell, as explained below:

Step B1: Pixel select transistor (SEL) 127B is ON, providing the specific row array selection from the array rows, and second, pixel anti-blooming transistor 121 (TX2) is ON, with VSS voltage level lower than VDD, preventing undesired parasitic signal generated in PD 121 from being accumulated in PD 121.

Step B2: Pixel reset transistor (RST) 126A is ON to fully deploy charge storage (MN/FD) 123 with charge and pixel anti-blooming (TX2) is ON preventing accumulation of undesired parasitic signal in PD 121.

Step B3: Pixel reset signal is sampled providing the pixel FD signal level prior accumulation of at least a single desired exposure (i.e. gate). The pixel reset signal may be subtracted from the pixel signal sample in step B18 to eliminate the offset signal (hence CDS which is done externally to the pixel in a gated configuration as illustrated in FIG. 2B). Pixel anti-blooming (TX2) is ON preventing accumulation of undesired parasitic signal in PD 121. Reset and reset read (steps B1-B3) for a specific signal readout may be carried out before or after the multiple exposures and signal readout (steps B4-B18).

Step B4: Pulse of light 91 (not part of the active gated imaging generated externally, e.g., by flickering objects 94, and is located in the gated imaging system FOV) is generated and anti-blooming (TX2) 121A is ON to prevent accumulation of undesired parasitic signal generated in PD 121.

Step B5: The pulse from the light source (not part of the active gated imaging but is located in the gated imaging system FOV) propagates to and is captured by pixel 120 and anti-blooming (TX2) 121A is turned OFF providing the beginning of signal 125 generated in PD 121 to be transferred via transfer gate (TX1) 124.

Step B6: Pixel transfer transistor (TX1) 124 is turned ON to transfer electrical signal 125 generated in PD 121 to charge storage 123 (MN/FD) followed by anti-blooming (TX2) 121A turned back ON ending the single gate transfer event and preventing accumulation of undesired parasitic signal generated in PD 121. TX1 ON period is equal or shorter than the light pulse time to accumulate the desired pulse transmitted signal and to reduce background signal accumulation.

Step B7: Pixel transfer transistor (TX1) 124 is OFF with and anti-blooming (TX2) 121A is ON to prevent accumulation of undesired parasitic signal generated in PD 121.

Step B8: Similar to Step B4 but may have a different duration than in Step B4. For example, the duration of Step B4 may be 1 μsec (Full Width Half Maximum) while the duration of Step B8 may be 0.5 μsec or 1.5 μsec, in non-limiting examples.

Step B9: Similar to Step B5 but may have a different duration than in Step B5. For example, the duration of Step B5 may be 1 μsec while the duration of Step B9 may be 0.5 μsec.

Step B10: Similar to Step B6 but may have a different duration than Step B6 to accumulate a light source pulse duration in Step B10 (equal or shorter than the light pulse time). For example, the duration of Step B6 may be 1 μsec while the duration of step B10 may be 0.6 μsec.

Step B11: Similar to Step B7 but may have a different duration than Step B7.

Step B12-Step B15: Similar to Step B4-Step B7 and to Step B8-Step B11 but may have different durations as indicated above. The pixel gate (light sub-exposure and accumulation) may be conducted once, twice or any number of gates (sub-exposures) per pixel single readout (#X).

Step B16: After at least a single gate transfer event, anti-blooming (TX2) 121A may be ON to prevent accumulation of undesired parasitic signal generated in PD 121.

Step B17-Step B18: Standard pixel readout (Signal read) is provided. While anti-blooming (TX2) 121A is ON to prevent accumulation of undesired parasitic signal generated in PD 121 and in FD 123, pixel select transistor (SEL) 127B is ON and the accumulated pixel signal is readout from FD 123 via the Source Follower (SF) transistor 127A and the Select (SEL) transistor 127B.

One of the key characteristic in multiply gated low noise pixel 120 is the opacity during gate OFF. Generated parasitic electrical signal in charge storage 123 (MN/FD) while the pixel gate is OFF (e.g., TX1 at OFF and TX2 at ON) may be reduced by masking charge storage 123, for example, by metal layers in the pixel structure, and/or by using the pixel micro-lens to channel the light away from charge storage 123. Opaqueness levels during gate OFF are required to be as low as possible, for example a requirement may be that the response to the signal collected in charge storage 123 divided by the intensity of light at the full integration time (gating (sub-exposures)/non-gating and readout time) shall be 0.01% at most. This value is required to cope with the backscatter intensity reflection in active imaging explained below and reject ambient light accumulation. Another example for pixel structure is presented in FIG. 6 below.

In active gated imaging, the rise time and fall time of transfer gate transistor (TX1) 124, anti-blooming transistor (TX2) 121A and of the source of light pulse (originating from pulsed illumination 95, as illustrated in FIG. 1A) are related directly to the depths of field distance and starting distance resolution/accuracy. In non-active gated imaging, the rise time and fall time of transfer gate transistor (TX1) 124, anti-blooming transistor (TX2) 121A and of the source of light pulse (not part of the gated imaging system but located in the gated imaging system FOV) are related directly to the signal accumulation of the pulse modulation.

FIGS. 4C-4G are high level schematic illustrations of operation patterns 120C-G of single pixel sensor 120, according to some embodiments of the invention.

Figure 4C:
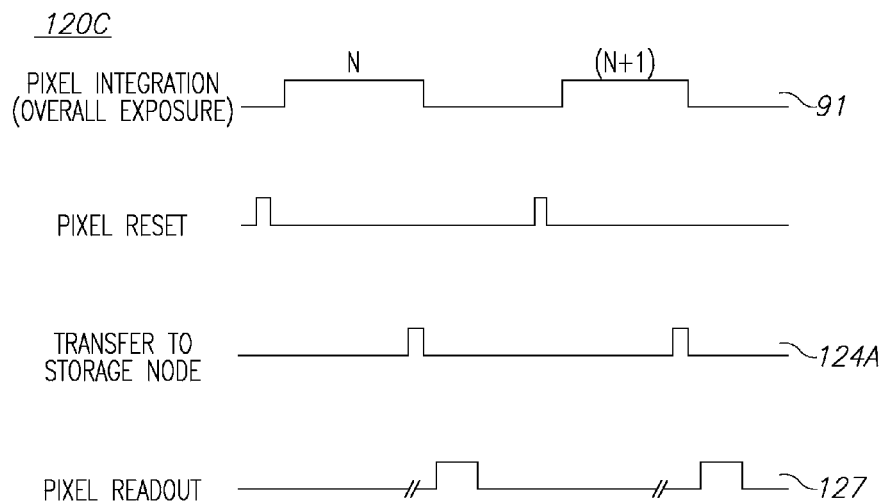
FIGS. 4C-4G are high level schematic illustrations of operation patterns of the single pixel sensor, according to some embodiments of the invention.

FIG. 4C schematically illustrates, as an exemplary operating mode 120C of pixel 120, according to some embodiments of the invention. Operating mode 120C may be understood as a global shutter mode, with FIG. 4C illustrating a $N^{th}$ and a $(N+1)^{th}$ periods of overall exposure (signal readout) of pixel 120 in global shutter operation mode 120B. Prior to each signal readout, such as the $N^{th}$ and the $(N+1)^{th}$, a pixel reset is carried out, which comprises resetting charge storage 123 (e.g., MN by reset transistor 126A) and resetting first transistor TX2 121A (select transistor 127B and source follower transistor 127A are not described). At the end of the single exposure period TX2 121A and TX1 124 transfer (124A) the signal to storage node 123. At the end of the accumulation process pixel readout 127 is carried out.

Figure 4D:
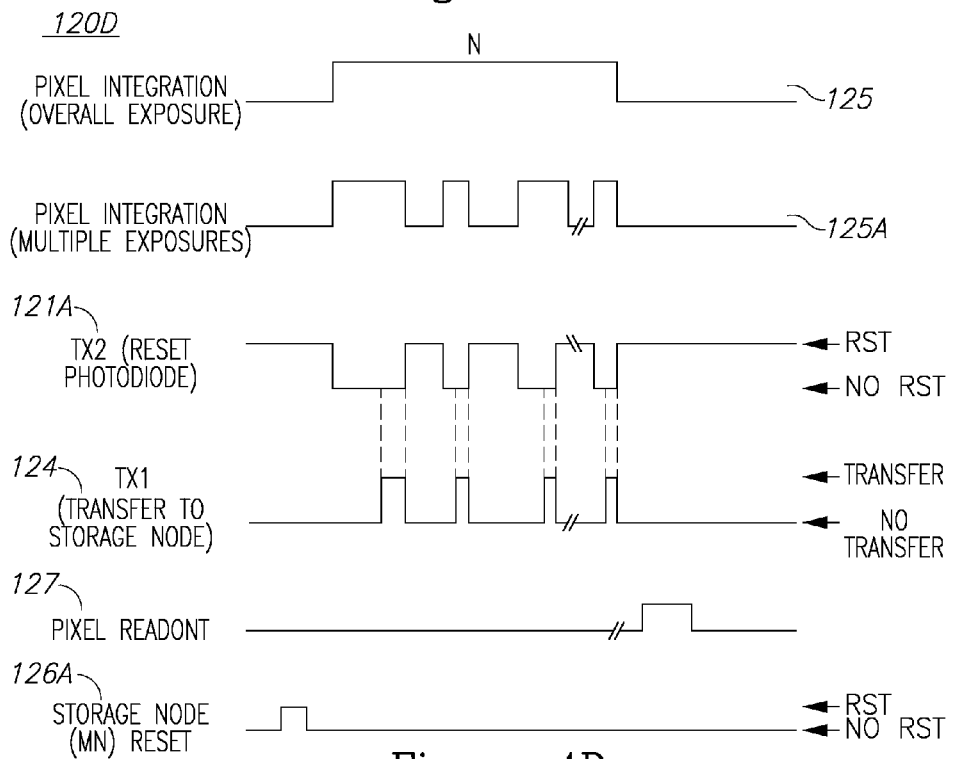

FIG. 4D schematically illustrates, as exemplary operating mode 120D of pixel 120, multiple sub-exposures 125A during a single overall exposure (signal readout) 125 (similar to operating modes 120A, 120B presented in FIGS. 4A and 4B), according to some embodiments of the invention. First transistor (TX2) 121A may be applied multiple times to reset photosensor 121 while second transistor (TX1) 124 may be employed intermittently to transfer signal 125 to charge storage 123. First transistor (TX2) 121A may be applied continuously to reset photosensor 121 until converting light 91 to signal 125 is set to start. Second transistor (TX1) 124, in conjunction to first transistor (TX2) 121A, may be configured to determine the duration of signal integration in charge storage 123, and may be operated in parallel to first transistor 121A, when the latter enables conversion by photosensor 121. The operation may be preceded by resetting charge storage (e.g., by reset transistor 126A) and followed by pixel readout 127. The durations of sub-exposures (gates) 125A may vary according to operational scenarios. This process may be used to provide multiple pixel integration (and/or multiple sub-exposures integration) within single pixel readout(s).

Figure 4E:
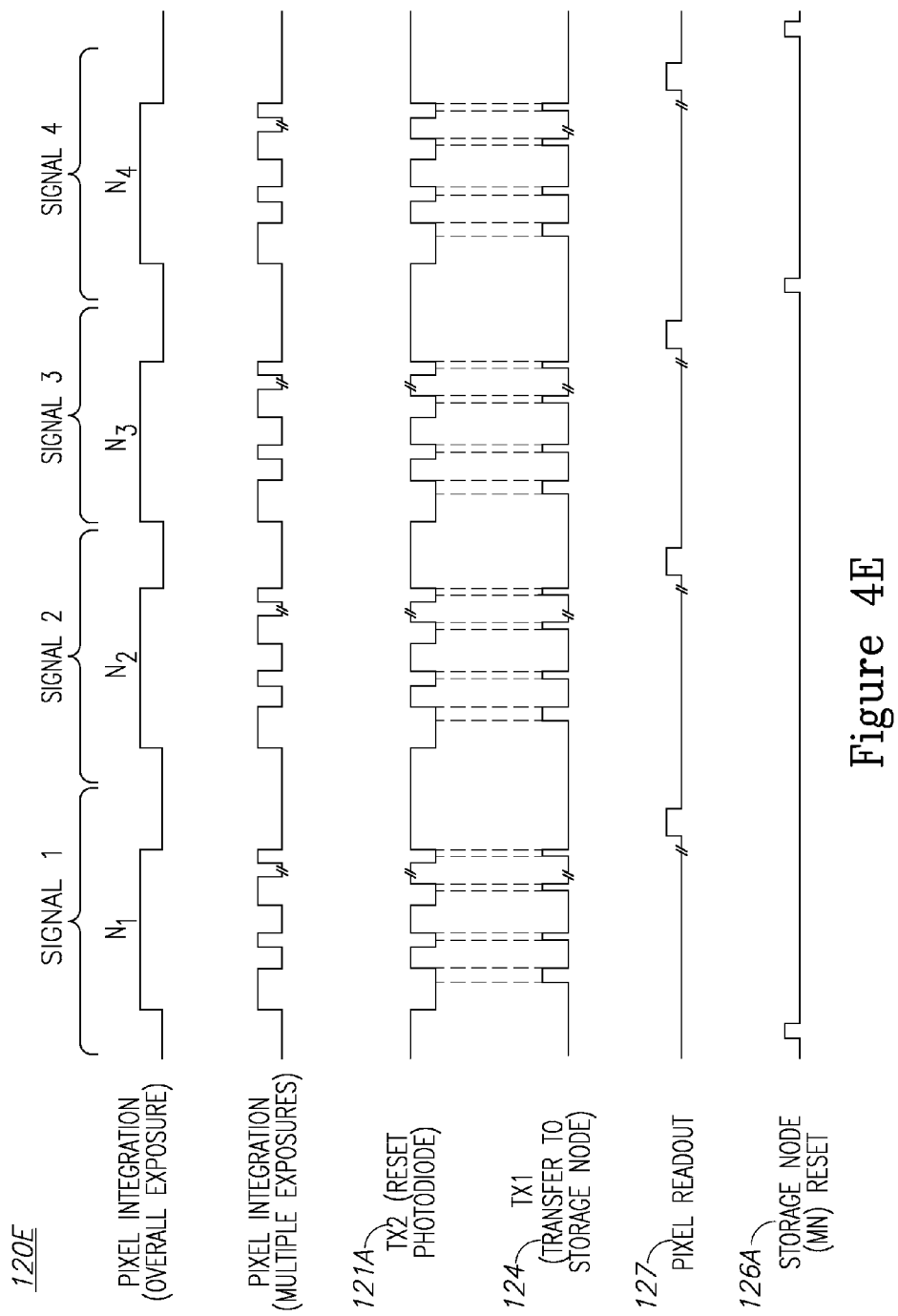

FIG. 4E schematically illustrates, as an exemplary operating mode 120E of pixel 120, the accumulation of signals, according to some embodiments of the invention. The sections denoted as Signal 1 through Signal 4 denote multiple periods ($N_1$ through $N_4$) in which exposures are accumulated. Signals 1-4 may be readout separately (see pixel readout 127) while the signal in storage node 123 may accumulate over more than one period, e.g., in the non-limiting illustrated example, image 2 includes the signal accumulated in the periods of Signals 1 and 2; and Signal 3 includes the signal accumulated in the periods of Signals 1, 2 and 3—before storage node 123 is reset 126A (e.g., if Signal 1 period comprises $N_1$=10 exposures, Signal 2 period comprises $N_2$=90 exposures and Signal 3 period comprises $N_3$=400 exposures, the readout Signals comprise 10, 100 (=10+90) and 500 (=10+90+400) exposures respectively. Advantageously, operating mode 120E may provide high dynamic range (HDR) imaging with respect to intense sources such as retro reflecting traffic signs or headlights by providing images with different extents of exposure periods. Operating mode 120E may also enable shorter capturing times as use is made of prior exposures. This operating mode may also be referred to as a non-distractive readout mode, as it implements the reading of multiple pixel readouts without influencing the accumulated signal of each signal readout.

In such an operating method the high PLS value is very important in order to avoid collecting undesired signal from ambient light sources or from uncorrelated light source illumination. In the non-limiting example, pixel array 130 Signal 1 may provide a DOF of 20-50 m with 100 pulses & sub-exposures, Signal 2 may provide an additional DOF of 50-90 m with 200 pulses & sub-exposures providing a DOF image of 20-90 m with 300 pulses & sub-exposures and Signal 3 may provide an additional DOF of 90-300 m with 600 pulses & sub-exposures providing a DOF image of 20-300 m with 900 pulses & sub-exposures. In another non-limiting example, pixel array 130 Signal 1 may provide a DOF of 20-50 m with 10 pulses & sub-exposures, Signal 2 may provide an additional DOF of 20-50 m with 90 pulses & sub-exposures providing a DOF image of 20-50 m with 100 pulses & sub-exposures and Signal 3 may provide an additional DOF of 20-50 m with 200 pulses & sub-exposures providing a DOF image of 20-50 m with 300 pulses & sub-exposures. In another non-limiting example, pixel array 130 Signal 1 may provide a "passive" image (i.e. without pulsed illumination 95) 100 sub-exposures (or global shutter/rolling mode), Signal 2 may provide a DOF of 0-50 m with 100 pulses & sub-exposures providing a DOF image of 0-50 m with 100 pulses & sub-exposures and Signal 3 may provide an additional DOF of 20-70 m with 200 pulses & sub-exposures providing a DOF image of 0-70 m with a total of 300 pulses & sub-exposures.

It is noted that the exposure may correspond one or more types of frames, e.g., active gated imaging over the full image range or part(s) therefrom (i.e., one or more DOF slice), passive imaging, flickering light source imaging, passive imaging, and any combination thereof.

Figure 4F:
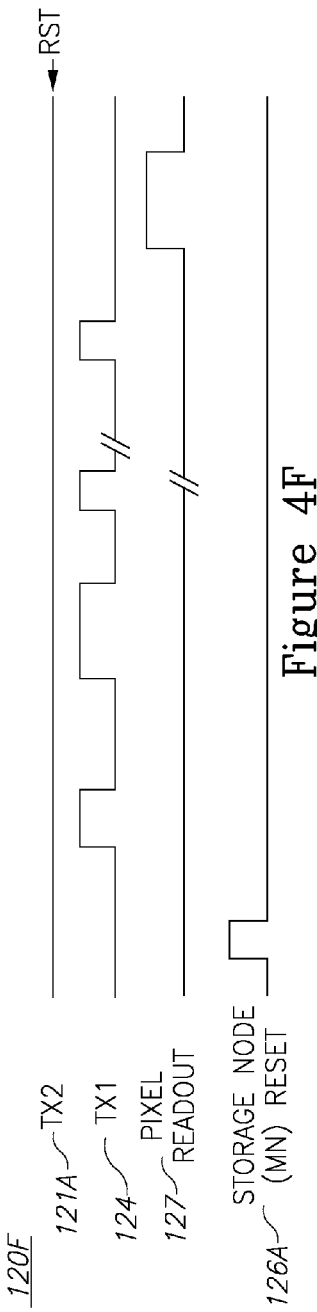

FIG. 4F schematically illustrates, as an exemplary operating mode 120F of pixel 120, the application of a noise correction following multiple exposures with different parameters, according to some embodiments of the invention. Noise corrections 120F may be integrated in any of the operating modes of pixel 120. The diagram illustrates reading noise parameters and then reducing them from the previously captured signal. Noise correction may be carried out following a period of sensor operation by accumulating the noise only using a similar sequence of exposures as the one used for gathering the signal, and accumulating the noise in charge storage 123, followed by noise readout and subtraction by image processor 115. First transistor 1221A may be in reset mode while second transistor 124 enables noise signal accumulation in charge storage 123 according to the same pattern as used previously to collect the signal. The operation may be preceded by resetting charge storage (e.g., by reset transistor 126A) and followed by pixel readout 127 to yield the noise and subtract it from previously captured signal.

Figure 4G:
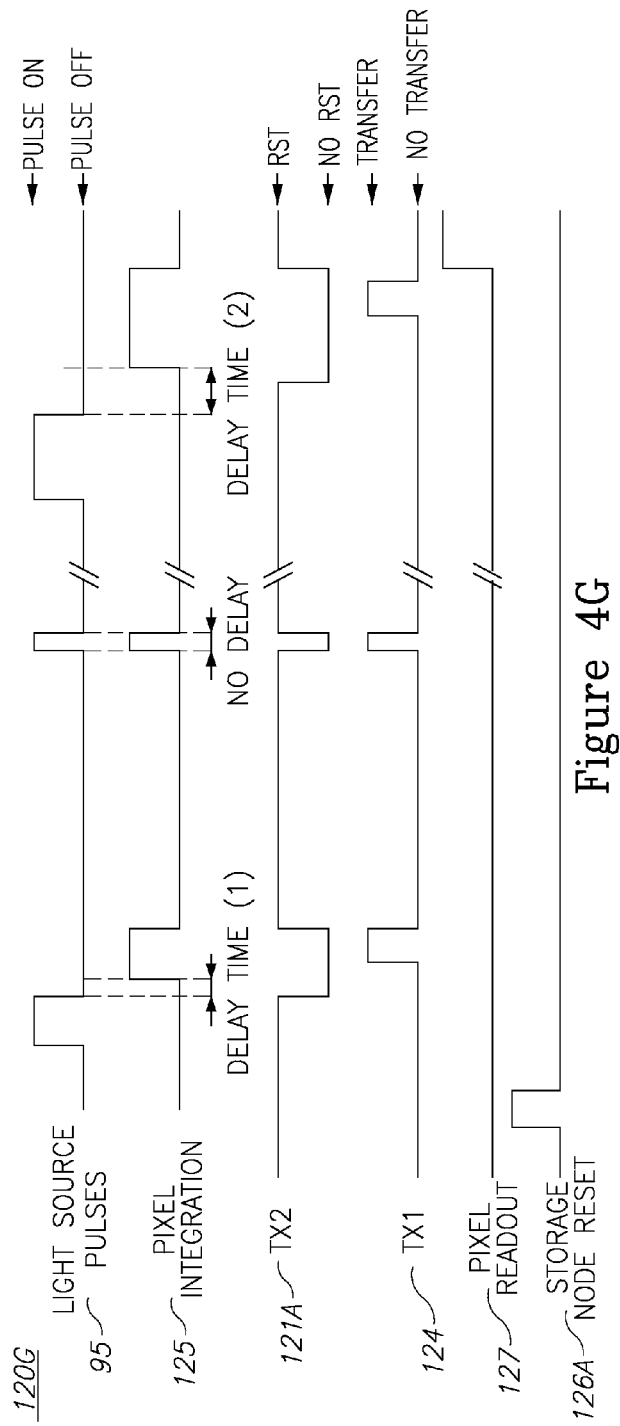

FIG. 4G schematically illustrates, as an exemplary operating mode 120G of pixel 120, active gated sensing, with light source pulses 95 followed by or concurrent with pixel integration periods (sub-exposures) to yield signal 125. Varying or no delays (see delay time (1), no delay time (2) in FIG. 4G) may be used, according to exposure requirements (see FIGS. 5A-5C for further details). As illustrated in FIGS. 4C and 4D, each pixel integration period may be preceded by first transistor 121A resetting photosensor 121 and second transistor 124 may be used to control the accumulation period in charge storage 123. The operation may be preceded by resetting charge storage (e.g., by reset transistor 126A) and followed by pixel readout 127.

FIGS. 5A-5D are high level schematic illustrations of operation patterns 132 of single pixel sensor 120, according to some embodiments of the invention. The operation patterns comprise related temporal sequences of illumination and detection parameters for active gated imaging or active gated sensing, which may be selected and composed into different patterns.

Figure 5A:
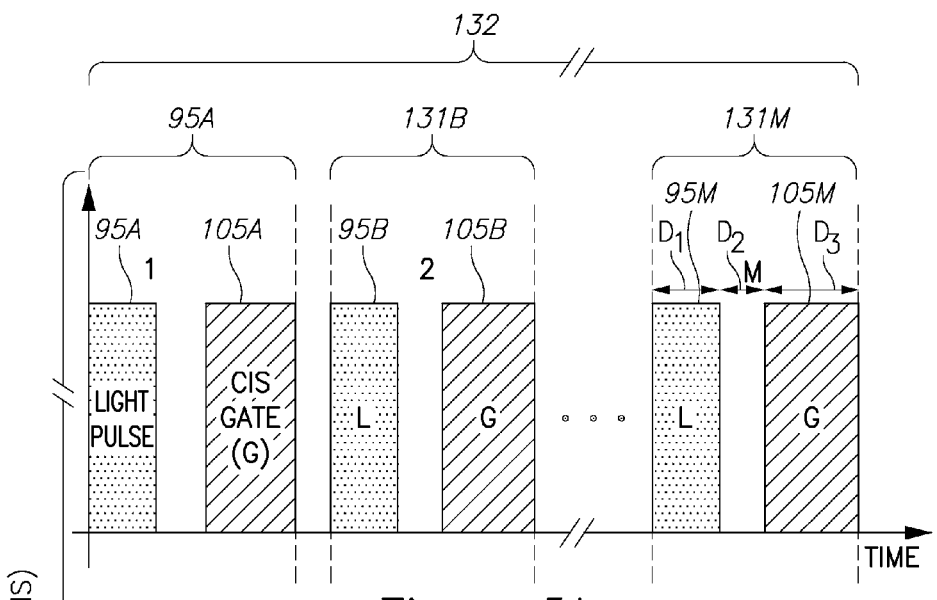
FIGS. 5A-5E are high level schematic illustrations of operation patterns of the single pixel sensor, according to some embodiments of the invention.

FIG. 5A schematically illustrates temporal sequences of pulsed illumination (L) 95 and sub-exposures and/or gates (G) of pixel 120, according to some embodiments of the invention. Gated pixel detector 120 may have multiple gates (denoted by "G" for detector gating, with "CIS" denoting exposure by CMOS image sensor) with different length time sub-exposures (gates) 105A, 105B . . . 105M in different timing sequence 131A, 131B . . . 131M to yield any number of operation patterns 132 per single image frame readout 127 (image frame readout duration is not illustrated). The frame may be used as a non-active detection frame (illumination L 95A, 95B, . . . , 95M being external, e.g., by flickering objects 94) and/or in association with active pulsed illumination 95. The durations of illumination periods (denoted $D_1$), capturing periods/sub-exposures (denoted $D_3$) and intermediate periods (denoted $D_2$) may be varied during a single exposure, e.g., to yield images of different volume portions 96 of scene 90 as explained above.

Figure 5B:
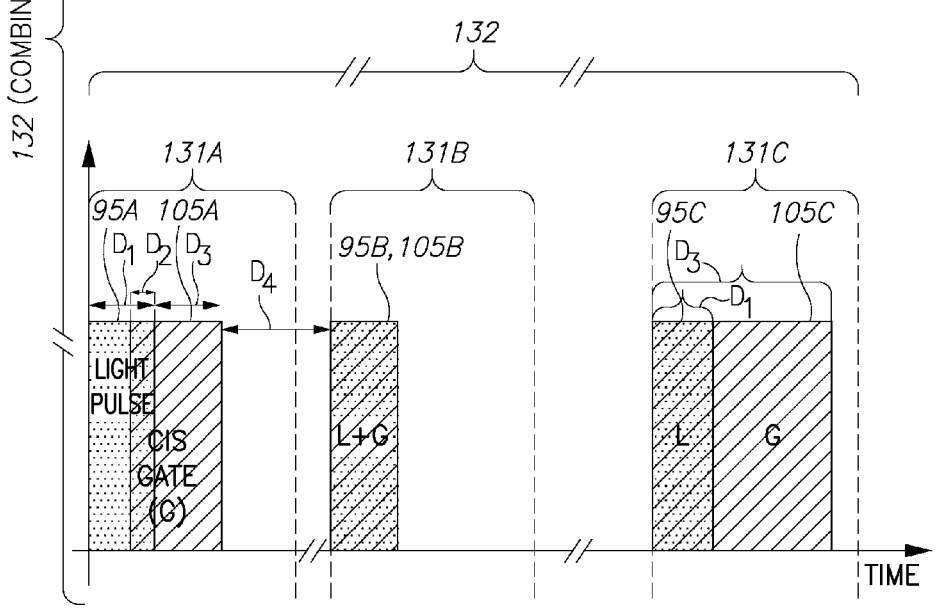

FIG. 5B schematically illustrates a generalized temporal sequence of illumination (L) 95 and sub-exposures and/or gates (G) of pixel 120, according to some embodiments of the invention. A specific pattern may comprise any number of elements 131A, 131B, 131C from the generalized pattern illustrated in FIG. 5B, possibly in combination with elements 131A, 131B, . . . , 131M illustrated in FIG. 5A—to yield any number of operation patterns 132. For example, illumination period 95A may partially overlap exposure period 105A, illumination period 95B may completely overlap exposure period 105A and/or exposure period 105C may overlap and extend beyond illumination period 95C, e.g., to capture different proportions of close reflections, background illumination and reflections from specified volume portions 96. The durations of illumination periods (denoted $D_1$), capturing periods/sub-exposures (denoted $D_3$) and overlapping periods (denoted $D_2$), as well as intervals between elements 132 (denoted $D_4$) may be varied during a single sub-exposure, e.g., to yield images of different volume portions 96 of scene 90 as explained above.

Figure 5C:
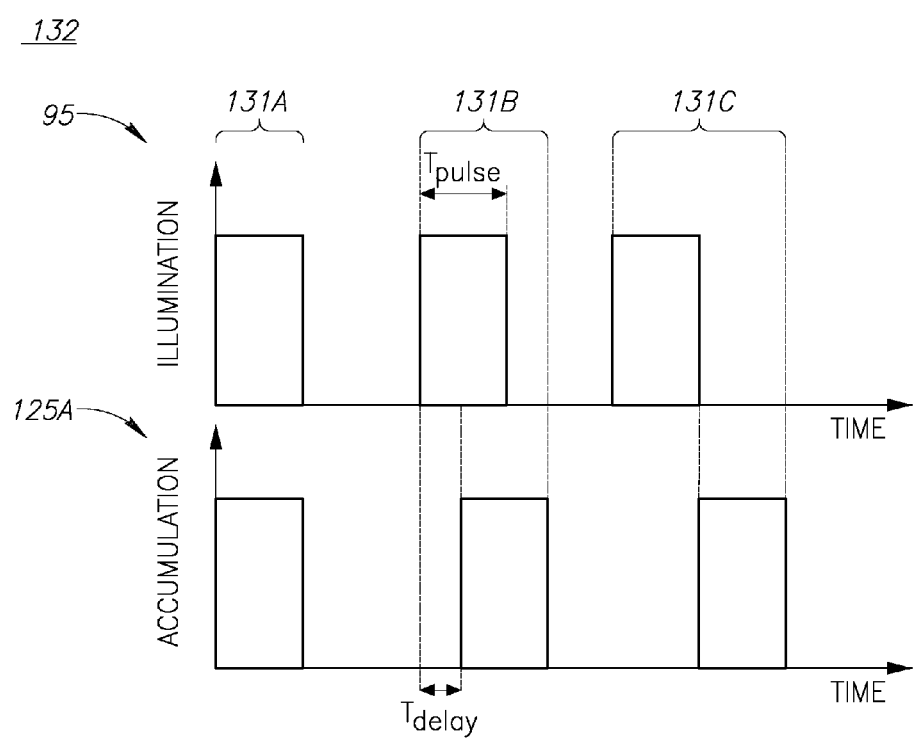

FIG. 5C schematically illustrates an operation pattern 132 with varying degrees of overlap between illumination pulses 95 and accumulation pulses (i.e., sub-exposures or gates) 125A, according to some embodiments of the invention. Single pixel sensor 120 may be configured to carry out at least one of repeated accumulations 125A of signals in at least partial overlap with at least one light pulse 95 generated by the pulsed illuminator. FIG. 5C schematically illustrates elements 131A, 131B, 131C which represent signals (or frames) with 100%, 50% and 0% overlap between illumination and accumulation periods (i.e., sub-exposures). Each of elements 131A, 131B, 131C may comprise multiple sequential illumination pulses and accumulation periods, and any degree of overlap may be implemented in various elements. Operation pattern 132 may be configured to measure scene visibility at different distances from the illuminator and/or to enhance the image of close range objects in clear atmospheric conditions (i.e., no particles or a low level of particles that cause no or low backscattering).

The degrees of overlap (expressed as percentage of illumination period after which accumulation begins, or $\% = T_{delay}/T_{pulse}$ with $T_{pulse}$ denoting the duration of each illumination pulse and $T_{delay}$ denoting the time from the beginning of the illumination pulse at which the accumulation period begins) may be adjusted according to the required measurement distances. Measurement of the backscatter at different overlaps may be used to detect static and/or moving objects (e.g., persons, vehicles, droplets, etc.) close to illuminator 95 and/or to conduct built-in functionality tests (BITs). Moreover, implementing the overlaps may be used to enhance close range image signals, for example to be used, in vehicle applications, for enhanced driver and/or computer vision, for night vision aid, for inclement weather aid, for LDW (Lane Departure Warning), FCW (Forward Collision Warning), ACC (Adaptive Cruise Control), Stop & Go, AEB (Automatic Emergency Breaking) etc. The degree of overlaps may be adjusted with respect to velocity, visibility, surroundings (urban/rural) etc. of the vehicle.

Figure 5D:
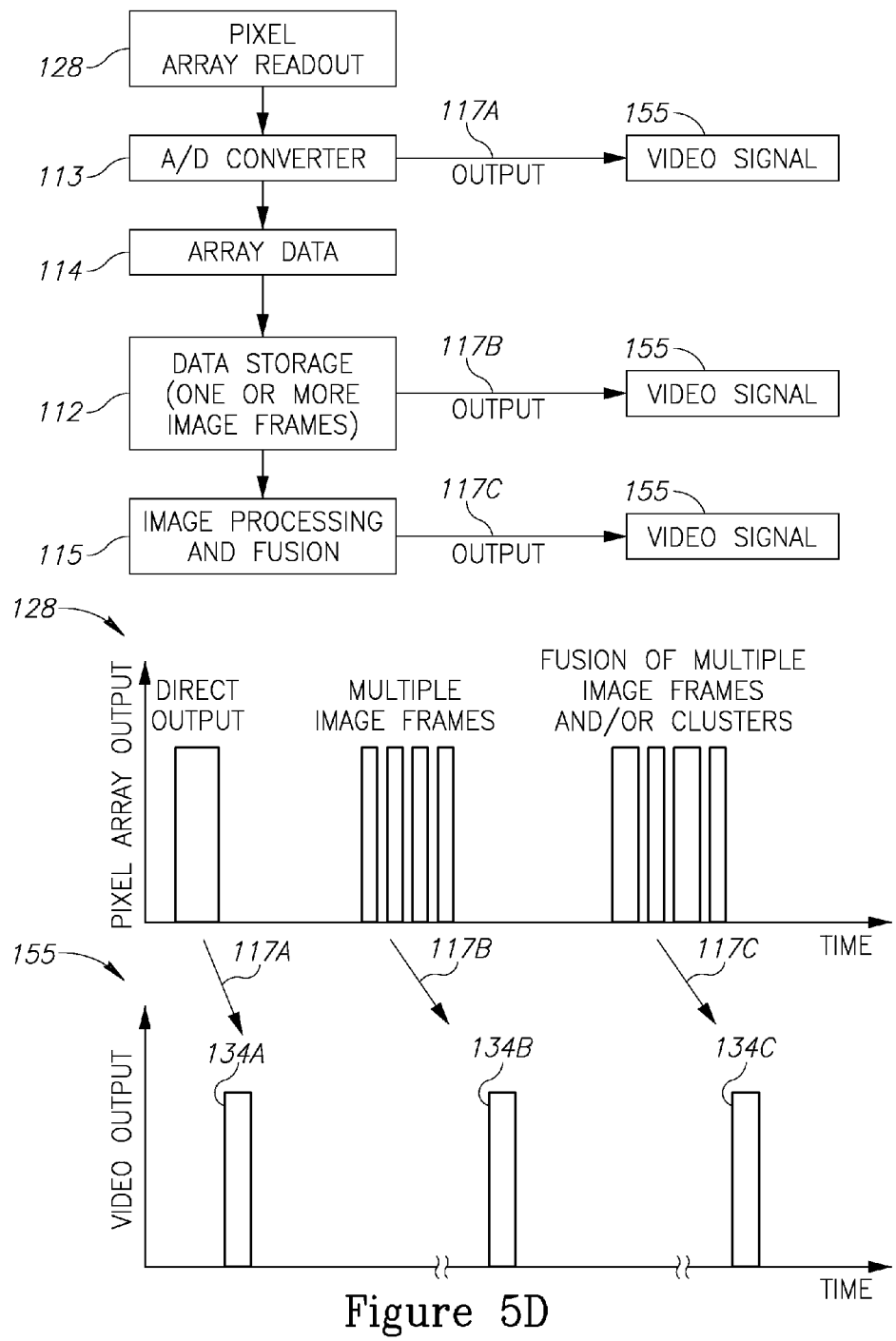

FIG. 5D schematically illustrates various video output possibilities, according to some embodiments of the invention. Pixel array readout 128, after being converted from analog to digital by an A/D (analog to digital) converter 113, may be directly output 117A to form video signal 155. Alternatively or complementarily, digital array data 114 (i.e., the data that represents the accumulated signal by the pixelated array) may be stored in a data storage 112 (such as, e.g., a Double Data Rate (DDR) or alike, off-chip or on-chip with respect to pixel array 130). Stored data may comprise data from one or more image frames and may be directly output 117B (after specified periods) to form video signal 155. Alternatively or complementarily, the stored data may undergo image enhancement (e.g., Fixed Pattern Noise correction, bad pixel correction, bad cluster correction, and/or image processing such as gamma correction, spatial and/or temporal filters) and/or data fusion at image processor 115 and then be output 117C to form video signal 155. Data fusion may be carried out with respect to different pixels within the pixelated array or clusters on the sensor, with respect to earlier exposures, with respect to data derived from earlier exposures and so forth.

As further illustrated in FIG. 5D, accumulated signals may be readout from the pixel and or image sensor (via digital interface such as LVDS—Low Voltage Differential Signaling, MIPI—Mobile Industry Processor Interface protocols or any other method), stored externally off-chip, and then outputted 155 according to any protocol and at any rate, e.g., according to video output specifications. In certain embodiments, overall image frames (comprising at least a single sub-exposure per single readout) and video outputs 155 may be synchronized 117A with video output 134A (e.g., the array image frames may be accumulated at an overall exposure periods (including RST and readout time) 0-10 ms, 33.3-36.3 ms, 66.6-80 ms and outputted as video frames 134A at 33.3 ms, 66.6 ms, 100 ms respectively, for 30 frames per second, in a non-limiting manner); or the image frames and outputs 155 may be unsynchronized 117B, C with respect to video output 134B, C (e.g., the frames may be overall accumulated at exposure periods 0-5 ms, 7-15 ms, 21-22 ms, and outputted as video frames 134B, C at 10 ms, 20 ms, 30 ms respectively). These versatile video outputs can be controlled as a function of bound rate (e.g., limited video bound rate may require lower video output frame rate), as a function of power consumption (e.g., for a system with limited power consumption there is a tradeoff between sensor data readout to data storage and video output framerate) as a function of system requirements (e.g., refresh rate, image latency, type of image to output etc.).

For example, disclosed gated CMOS pixel and/or image sensor (i.e. consisting at least a single pixel) implementation for indirect time-of-flight (iTOF) measurements of pixel distance of objects use partial overlaps (which may range between 0-100%) between the sub-exposures (accumulation periods 125A) to pulse light (illumination periods 95) to enhance close range imaging in active gated imaging and provide the iTOF measurements. Gated CMOS pixel and/or image sensor implementations advantageously enable elimination of back scatter issues, enable using multiple illumination pulses and accumulation periods in a unified way (i.e., accumulation of signal as a function of the range) to derive signals and measurements, enables a linear gain implementation (versus a nonlinear gain mode such as a Geiger gain mode in SPAD), enables a reliable/uniform CMOS process, enables a high resolution pixel array (i.e., image sensor) having for example QVGA, VGA, HD etc., enables high fill factor, enables high QE and provide slices (defined by a depth of focus DOF range) in the captured scene. Moreover, disclosed gated CMOS pixel and/or image sensor implementations with partial overlap between one or more accumulation period and illumination pulse enable derivation of measurable signals at close range (reducing the effects of rise time of accumulation and/or illumination), reduces the need for high synchronization between the light source and the sensor and related electronics and shutter control complexity. Disclosed gated CMOS pixel and/or image sensor implementations may be configured to adjust the delay times ($T_{delay}$) to environment conditions, e.g., use $T_{delay}=0$ for indoor applications and adjust the value of $T_{delay}>0$ according to the type of scattering medium in the scene (e.g., particles of dust, snow, droplets etc.). Alternatively or complementarily, a number of accumulation periods which overlap illumination pulses may be adjusted according to the environmental conditions.

Figure 5E:
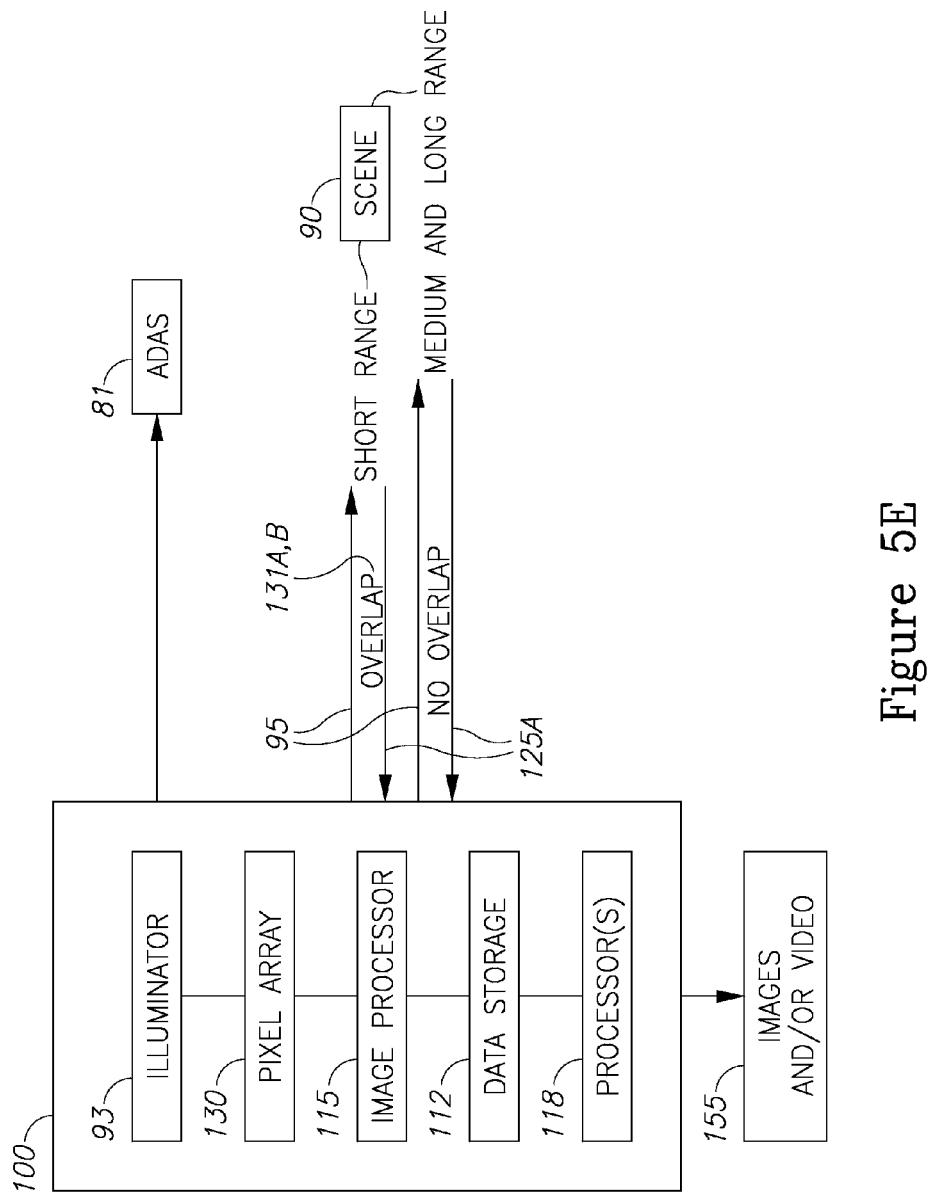

FIG. 5E is a high level schematic illustration of imaging and/or ranging system 100, according to some embodiments of the invention. System 100 is shown only schematically, and elements from other figures, e.g., FIGS. 1A, 2A, may be part of it as well. Scene 90 comprises short range elements and medium and long range elements, which may be sensed differentially by system 100 using different overlaps 131A, B or no overlaps between illumination 95 and accumulation 125A. System 100 may be configured to generate images of scene 90 from multiple readouts 128 and to adjust the at least partial overlap to enhance short range image elements. In this way, system 100 may be configured to improve short range imaging. Alternatively or complementarily, short range sensing may be used to provide alerts, adjust system 100 or other systems associated with system 100 and/or associated with a vehicle in which system 100 operated and may be used to support and improve system decisions.

In certain embodiments, system 100 may be configured to adjust the at least partial overlap according to requirements from an associated advanced driver assistance system (ADAS) 81 and/or an autonomous vehicle. System 100 may be configured to apply indirect time of flight (iTOF) algorithms with respect to the at least partial overlap, as explained above. Sensing of close range scene elements may be used to initiate the activation of the iTOF algorithms. System 100 may be configured to carry out image processing prior to outputting images and/or video signal 155, as explained above. System 100 may comprise additional one or more processor(s) 118 configured to carry out any of the processing stages disclosed herein (e.g., in method 200 below).

The image processing by image processor 115 may further comprise combining data from one or more image frames, one or more pixel clusters, multiple pixels and/or image frames captured with different partial overlaps. System 100 may further comprise data storage 112 configured to store multiple readouts 128 temporarily, and the image processing may be carried out with respect to stored readouts. System 100 may be configured to synchronize its output according to a predefined video protocol.

Advantageously, with respect to Bellisai et al. 2013 cited above, disclosed a triggered low resolution SPAD implementations provide nonlinear response of the sensor, which is advantageous, provide higher resolution (in Bellisai et al. 2013 the pixels are set at a very low fill factor and require quenching after single photon detections) and enable multiple sub-exposures per single readout (higher SNR) as well as outdoor implementation for long distance, due to peak power of light source and/or low noise of triggered pixel. Moreover, disclosed gated CMOS pixel and/or image sensor implementations provide flexibility to integrate range-providing information (iTOF) based on different types of images (as described above in FIGS. 5B, 5C) and/or image frames and can be implemented a moving platform, taking into account the speed of platform.

Certain embodiments comprise imaging system 100 comprising pulsed illuminator 93 and gated imaging array(s) 130 comprising a single pixel sensors 120. At least one of single pixel sensors 120 comprises photosensor 121 configured to convert light into proportional signals, charge storage 123 configured to accumulate, repeatedly, a plurality of the signals converted by photosensor 121, first transistor 121A coupled between a pixel voltage terminal and photosensor 121, second transistor 124 coupled between photosensor 121 and charge storage 123, and readout circuit 126 coupled between charge storage 123 and the output channel. Single pixel sensor 120 may be further configured to carry out the repeated accumulations of signals multiple times per each readout by readout circuit 126, to synchronously convert reflections of light emitted by the illuminator, and wherein the single pixel sensor is further configured to carry out at least one of the repeated accumulations of signals in at least partial overlap with at least one light pulse generated by pulsed illuminator 93.

System 100 may be further configured to derive a scene visibility (comprising, e.g., an environmental backscattering measure) from at least one of the repeated accumulations and optionally adjust operation parameters of gated imaging array(s) 130 according to the derived scene visibility, e.g., the at least partial overlap may be adjusted according to the derived scene visibility. System 100 may be further configured to derive the scene visibility from at least one of the repeated accumulations that at least partially overlaps at least one light pulse, possibly at different distances from illuminator 93 according to a measure of the at least partial overlap (e.g., an overlap percentage, a $T_{delay}$ etc.) between the at least one of the repeated accumulations and the at least one light pulse. Optionally, system 100 may be further configured to determine the at least partial overlap and the at least one overlapped light pulse according to the scene visibility at different distances from illuminator 93. System 100 may be further configured to determine, independently from the signal accumulations, the at least partial overlap and the at least one overlapped light pulse according to a scene visibility at different distances from illuminator 93. System 100 may be configured to derive a functionality test result (e.g., verify an expected signal from a known target) from at least one of the repeated accumulations.

In certain embodiments, imaging system 100 may be configured to enable different pulse and/or sub-exposure durations, frequencies, rise and/or fall times, and pulse amplitudes, adapted to required images, depth data and environmental conditions.

Imaging system 100 may be configured to enable triggering (gating) different pixel clusters (see e.g., 130A in FIG. 1) of the pixel array 130 to collect different signal levels by controlling the durations of signal integration window at each cluster—providing the ability to accumulate the different intensity levels in a single image frame. Moreover, imaging system 100 may be configured to use some pixel clusters in array 130 to collect ambient light in order to fuse the range data from other pixel clusters with image data in a single image. Array(s) 130 may be configured to operate with different durations of the signal accumulations in different pixel clusters 130A. In certain embodiments, specified pixel clusters 130A may be further configured to operate with different partial overlap periods and system 100 may be further configured to use at least one of the pixel clusters to collect ambient light, use a plurality of the pixel clusters to collect image signals and derive an image from the collected image signals and the collected ambient light.

The multiple gated pixel may have a thick epitaxial layer above 12 μm and/or high resistivity layer as starting material for pixel wafer providing a higher PD spectral response (directly related to pixel fill factor and quantum efficiency) in the near infrared (NIR) to values above 50%. As the epitaxial layer is made thicker the spectral response becomes larger but the modulation transfer function (MTF) of the pixel becomes lower. For active gated imaging used mainly for night vision application the MTF reduction due to the thick epitaxial layer and/or high resistivity layer is less important than increasing the spectral response due to large pixel dimensions, preferably larger than 5 μm by 5 μm. The large pixel is required to accumulate more reflected light signal (by having a larger pixel area) whereas the resolution during low light level (e.g., less than 0.1 lux) is not required. The multiple gated pixel 120 and multiple gated sensor 130 may be produced using CMOS technology which complies with vehicular environment, enduring high temperature storage and operation (above 50° C.), avoids reduced sensitivity due to solar irradiance, and exhibits no burn effect due to a constant static image projection to the gated pixel.

Figure 6:
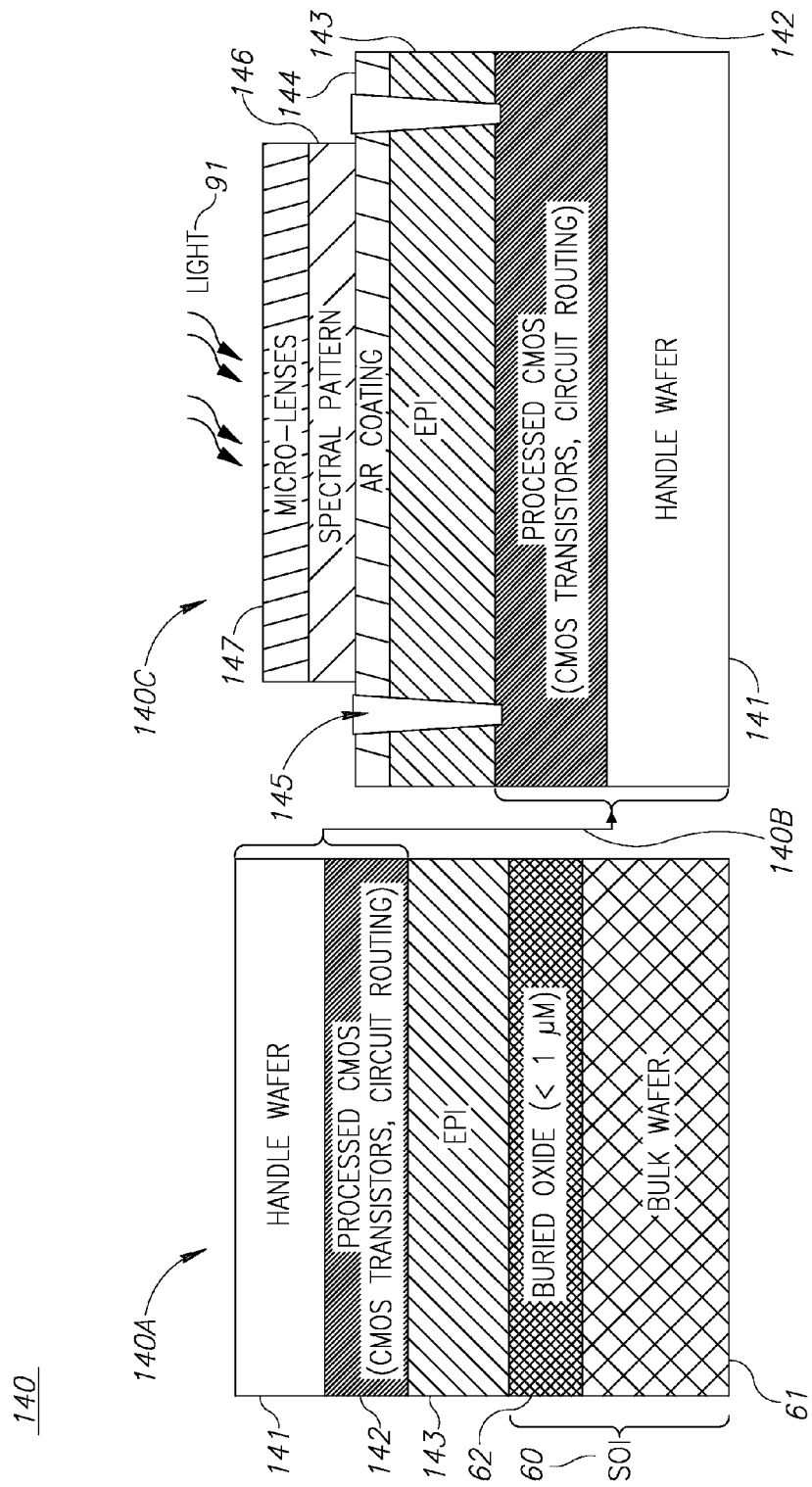
FIG. 6 is a high level schematic illustration of producing the backside illuminated pixel array, according to some embodiments of the invention.

FIG. 6 is a high level schematic illustration of producing backside illuminated pixel array 130, according to some embodiments of the invention. Sensor 130 comprises multiple pixels 120 as individual picture elements, which are laid out in a matrix design. Each pixel 120 is associated with a front micro-lens, backside sensors, and electric circuitry (e.g., of transistors 121A, 124, 126A, 127A, 127B and/or of charge storage 123), which reduces the captured light by the sensing layer in front-illuminated sensors. In contrast, back side-illuminated sensors 120, the electric circuitry is below the sensing layer, which improves sensitivity as well as leakage from the circuitry and from adjacent pixels, and respective noises. Sensor production 140 is illustrated in part 140A, in which electric circuitry 142 (using e.g., CMOS technology) is produced on an epitaxial layer 143 of 3 to 10-18 μm epitaxial layer that provides high resistivity, deposited on a basis 60 (SOI—silicon on insulator, comprising buried oxide insulator 62 (<1 μm) on bulk wafer 61), and a handling wafer 141 is deposited thereupon, to enable turning over 140B electric circuitry layer 142 after removal of basis 60 (layers 61, 62), to serve as the bottom layer of sensor 120. On epitaxial layer 143 (stage 140C), after BSI (back-side illuminated) passivation, an antireflection coating 144 is deposited, pad openings 145 are produced and then spectral pattern layers 146 are deposited (see FIGS. 7A-7E below) and micro-lenses 147 are attached. Processing 140 yields backside illuminated pixels which enable to reduce the dimensions (pitch) of gated pixel 120 (e.g., be at the order of 5 μm×5 μm, and/or have a pitch of 5 μm or smaller) while preserving a good fill factor and thus achieving better sensitivity; to improve the protection of charge storage 123 (memory node MN/floating diffusion FD) from ambient light and from cross-talk between pixels 120; to enable better shuttering contrast (avoiding overflow, reducing cross talk, and diminishing ambient light due to position deeper in the wafer); to improve MTF as the electronics 142 do not interfere in the light path; to enable introduction of unique spectral patterns 146. Spectral patterns 146 may be designed as part of corresponding spectral filter(s) 149 (see FIGS. 7B-7E). Coupled with the introduction of V control 123B and/or coupled with low point-spread-function (PSF) in the optics, pixel array 130 has lower cross-talk (due to MN leakage) between pixels 120.

Figure 7A:
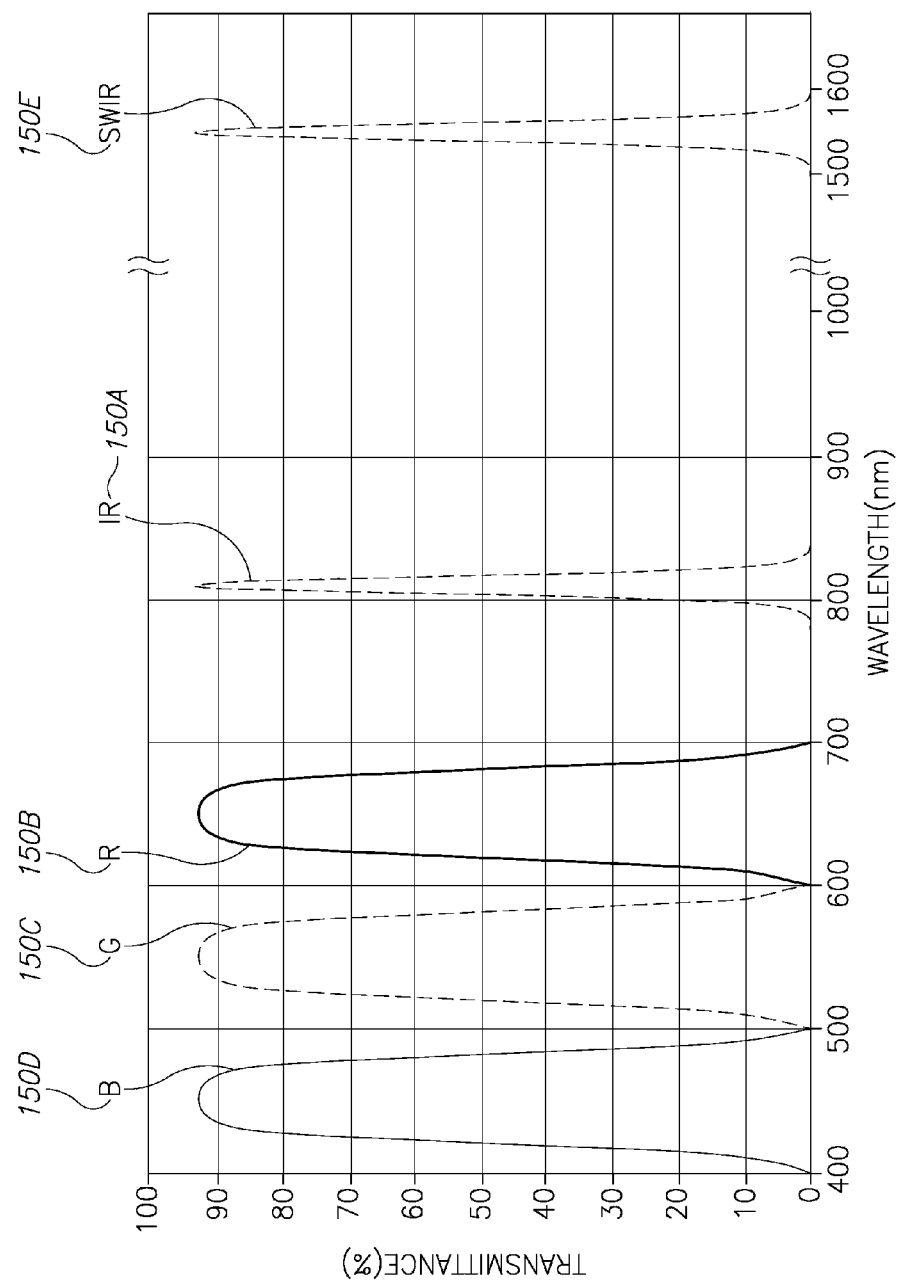
FIG. 7A is a high level schematic illustration of spectral curves of filtering layers, according to some embodiments of the invention.
Figure 7E:
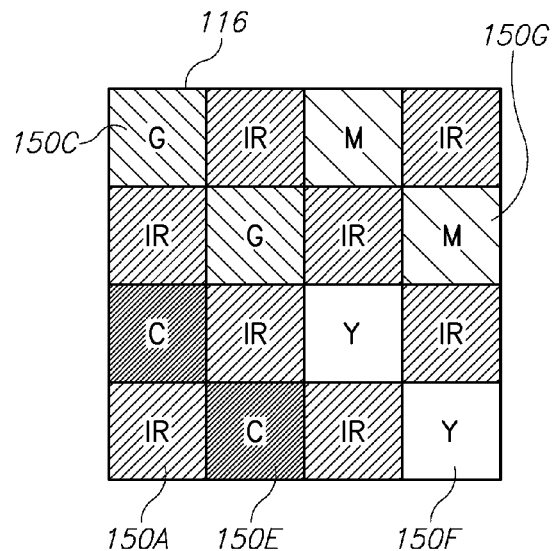

FIG. 7A is a high level schematic illustration of spectral curves 150A-D of filtering layers 146, according to some embodiments of the invention. Spectral curves 150A, 150B, 150C, 150D are non-overlapping and correspond to NIR (noted in FIG. 7A as IR) and visible ranges R (red), G (green) and B (blue), respectively. Certain embodiments may comprise filtering layers 146 which combine some of spectral curves 150A-D, e.g., combing NIR 150A (typically coupled to pulsed illumination 95 wavelength) with each of R, G, B 150B-D. Alternatively, certain embodiments may also have standard R, G, B implemented in foundries whereas R, G, B may be partial overlapping in the visible spectrum and/or partial overlapping in the NIR spectrum. Certain embodiments may comprise transmission peaks and/or spectral widths that differ between each type of spectral filter. Certain embodiments may comprise different Center Wavelengths (CWL) for the spectral curves as opposed to FIG. 7A, for example NIR 150A CWL may be in 905 nm or 860 nm.

In addition, FIG. 7A schematically illustrates a spectral range 150E (typically coupled to pulsed illumination 95 wavelength) of a gated SWIR sensor, illustrated in FIG. 8 below.

Spectral filter(s) 149 including pattern(s) 146 may be introduced in front of multiple gated pixel 120 and/or multiple gated pixel array 130 in active imaging or non-active imaging to reduce ambient light accumulation at daytime, nighttime and other ambient light conditions. Spectral filter 149 may be implemented in the pixel array level as a mosaic filter array, in which spectral filters 146 are arranged on a square grid that is at least partially congruent to photo-sensors 120. Filter pattern 149 may comprise e.g., 25% green, 25% red, 25% blue and 25% NIR or SWIR (termed RGB-IR). Filter pattern 149 may comprise e.g., 50% clear (open to a wide spectral wavelengths), 25% red and 25% IR (termed CCR-IR). Filter pattern 149 may comprise e.g., 25% clear, 25% IR in one specific wavelength and 25% IR in a different specific wavelength (termed CR-IR$_1$-IR$_2$) (e.g., C: 450-850 nm, R: ~650 nm, IR$_1$: 780-800 nm and IR$_2$: 810-850 nm). Filter pattern 149 may comprise any other combination of green, red, blue, clear and IR.

In certain embodiments, a standard Bayer filter pattern and an IR pattern may be introduced in front of multiple gated pixel 120 and/or multiple gated pixel array 130 as illustrated in FIGS. 7B-7E in active or non-active configuration.

In certain embodiments, a standard Bayer filter pattern with a NIR/SWIR cut filter and a NIR/SWIR pattern may be introduced in front of multiple gated pixel 120 and/or multiple gated pixel array 130 as illustrated in FIGS. 7B-7E in active or non-active configuration.

In certain embodiments, a Bayer filter pattern and a NIR/SWIR pattern may be introduced in front of multiple gated pixel 120 and/or multiple gated pixel array 130 in active or non-active configuration.

In certain embodiments, a polarization filter may be introduced in front of multiple gated pixel 120 and/or multiple gated pixel array 130 in active or non-active to reduce ambient light accumulation at daytime, nighttime and other ambient light conditions.

FIGS. 7B-7E are high level schematic exemplary illustrations of filter patterns 149, according to some embodiments of the invention. Filter patterns 149 may be repeated on pixelated array 130. The pattern filter 149 is represented schematically with respect to areas 116 with respective indicated color ranges (e.g., R, G, B for red, green and blue, C, M, Y, G for cyan, magenta, yellow and green, IR for infrared or SWIR spectrums). Areas 116 may correspond to single pixels 120 or to groups of pixels such as clusters 130A or other groups. Image controller 110 may be arranged to modify pattern filter 149 according to operational circumstances (such as capturing conditions or enhancement requirements), e.g., to increase a number of infrared pixels upon detection of low visual range visibility. It is noted that the optical channel in front of array 130 is not illustrated. The optical channel (comprising e.g., lenses, mirrors, fiber-optics etc.) is configured to optimize the optical parameters (such as MTF, distortion, transmissions etc.) for the whole pixel array spectrum in the FOV of the sensing unit. It is further noted that in any of the embodiments, system 100 may be configured to have a controllable f-number (the f-number of an optical system is the ratio of its focal length to the diameter of its entrance pupil), which may be controlled by any of a mechanical shutter, an electro-mechanical shutter and/or an optical shutter. In certain embodiments, the f-number may be controlled via an optical shutter comprising a ring, e.g., coated on at least one of the optical elements, made of a material having a refractive index that depends on the intensity of entering light in a way that makes it opaque at high light intensity (e.g., during daytime) to effectively reduce the pupil diameter (and respective large f-number) and transparent at low light intensity (e.g., during low light conditions) to maintain a relatively large pupil (and respective small f-number). In certain embodiments, the f-number may be controlled by any form of optical shutter covering a part of at least one optical element and made of said material. In certain embodiments, an optical shutter may be used to attenuate strong illumination or reflections during daytime or night time (e.g., approaching main beams, opposite illuminating system 95 etc.).

As illustrated schematically in FIGS. 7B-7D, spectral filter(s) 149 may comprise a pixelated pattern comprising near infrared (NIR) and red, green and blue (RGB) filtering elements 116 (denoted 150A, 150B, 150C, 150D, respectively) positioned in front of individual pixels 120. NIR and RGB filtering elements may be implemented as respective bandpass filters (BPF), RGB filtering elements being possibly implemented with a NIR cutoff. For example, the pixelated pattern may be a 4×4 pattern with respect to single pixel sensors 120 of gated imaging array 130.

Figure 8:
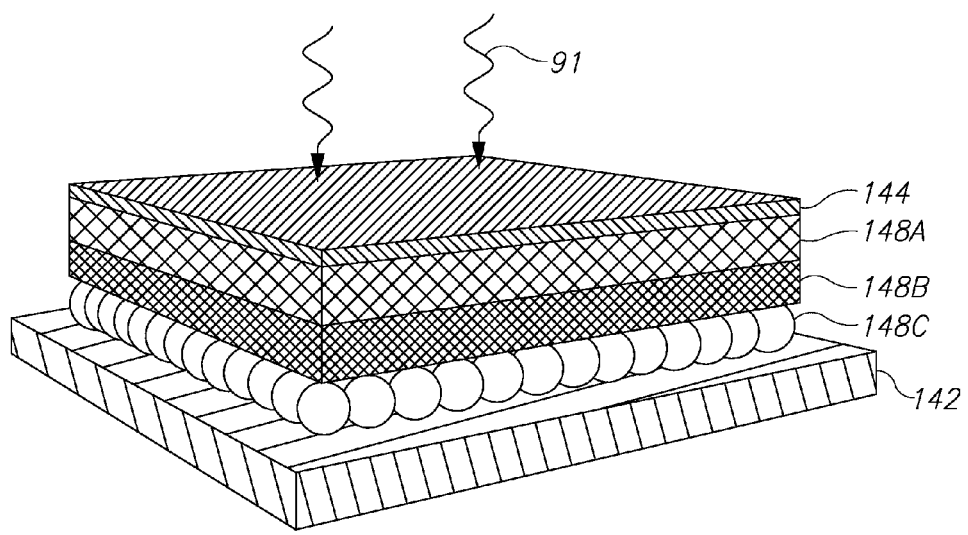
FIG. 8 is a high level schematic illustration of an exemplary single pixel sensor, according to some embodiments of the invention.

FIG. 8 is a high level schematic illustration of an exemplary single pixel sensor 120, according to some embodiments of the invention. In the illustrated non-limiting example, a CMOS-based photo-detecting element (PD 121) may be replaced by a P-I-N diode array substrate, comprising, e.g., a thinned InP substrate 148A, an InGaAs layer 148B and Indium bump bonds 148C, deposited upon CMOS readout circuit 142. Single pixel sensor 120 may be used to provide gated SWIR imaging. In certain embodiment, gated SWIR pixel array 130 may be housed in a sealed hermetic package. In certain embodiment, gated SWIR pixel array 130 may have a thermal electrical cooler within the package. Single pixel sensor 120 may be configured as a hybrid structure sensor operating in SWIR and optionally in visible range, with photosensor 121 being implemented in InGaAs layer 148B.

Figure 9:
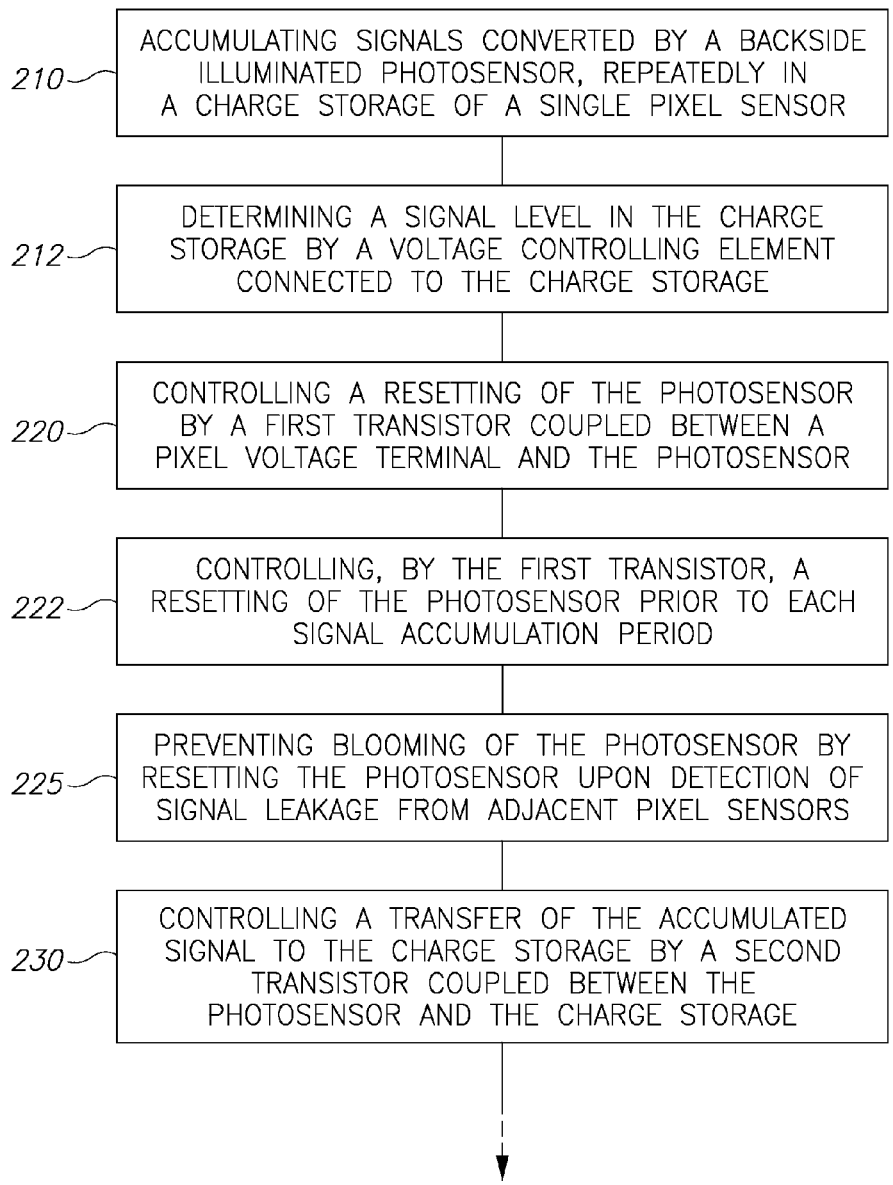
FIG. 9 is a high level flowchart illustrating a method, according to some embodiments of the invention.

FIG. 9 is a high level flowchart illustrating a method 200, according to some embodiments of the invention. Method 200 comprises accumulating, repeatedly, in a charge storage of a single pixel sensor, a plurality of signals that are proportionally converted by a photo sensor from corresponding light, wherein the single pixel sensor is backside illuminated by the light (stage 210), controlling a resetting of the photosensor by a first transistor coupled between a pixel voltage terminal and the photosensor (stage 220), controlling a transfer of the accumulated signal to the charge storage by a second transistor coupled between the photosensor and the charge storage (stage 230), and configuring the single pixel sensor to carry out the repeated accumulations of signals multiple times per each readout of the charge storage by a pixel readout circuit (stage 240), wherein the single pixel sensor is configured to synchronously collect and convert reflections of light emitted by an associated illuminator or to collect and convert light emitted by non-associated flickering light sources (stage 250).

Method 200 may further comprise controlling, by the first transistor, a resetting of the photosensor prior to each signal accumulation period (stage 222) and transferring, by the second transistor, at least a portion of the accumulated signal from the photosensor to the charge storage (stage 232).

Method 200 may further comprise preventing blooming of the photosensor by resetting the photosensor upon detection of signal leakage from adjacent pixel sensors (stage 225).

Method 200 may further comprise resetting the charge pixel storage at beginnings of signal accumulation periods by a reset transistor coupled between the charge storage and the pixel voltage terminal (stage 242).

Method 200 may further comprise determining a signal level in the charge storage by a voltage controlling element connected to the charge storage (stage 212).

Method 200 may further comprise configuring the single pixel sensor to synchronously convert reflections of light emitted by an illuminator 250, and to carry out at least one of the repeated accumulations of signals in at least partial overlap with at least one light pulse generated by the pulsed illuminator (stage 260).

Method 200 may further comprise adjusting the overlap to enhance short range image elements (stage 262) and/or adjusting the overlap according to requirements from ADAS and/or autonomous driving functions (stage 264).

Method 200 may further comprise applying indirect time of flight (iTOF) algorithms with respect to the overlap (stage 266). Method 200 may further comprise processing image frame(s) and/or pixel cluster(s) prior to outputting a video signal (stage 268).

Method 200 may further comprise deriving a scene visibility from at least one of the repeated accumulations and optionally adjusting at least one of the accumulating, the controlling and the at least partial overlap according a scene visibility (stage 270). Method 200 may further comprise adjusting different pixel clusters of the sensor to have different at least one of the accumulating, the controlling and the at least partial overlap, and fusing data from pixel readouts from the pixel clusters. Generally, method 200 may comprise applying different temporal relations between illumination and accumulation for different pixel clusters and fusing the respective readouts (stage 280). Method 200 may further comprise storing readouts temporarily and synchronizing the output according to a predefined video protocol (stage 285).

While U.S. Patent Application Publication No. 20110080500 teaches an indicia reading terminal having an image sensor pixel array incorporated therein, where the terminal is operative for decoding of decodable indicia and for providing frames of image data (e.g., color) for storage, display, or transmission—it fails to teach at least the following aspects of the present invention: Gated sensors, sensing of flickering light sources, aggregation of multiple images at the accumulation portion, the spectral filters and backside illuminated sensors.

U.S. Patent Application Publication No. 2015/009375 teaches an imaging system with an image sensor having an array of image pixels. Each image pixel may include an electronic shutter for controlling when a photosensor in the image pixel accumulates charge. The electronic shutter may be operable in an open state during which charge is allowed to accumulate on the photosensor and a closed state during which charge is drained from the photosensor. The electronic shutter may be cycled through multiple open and closed states during an image frame capture. At the end of each open state, the charge that has been acquired on the photosensor may be transferred from the photosensor to a pixel memory element. By breaking up the total exposure time for a pixel during an image frame into shorter, non-continuous periods of exposure time, dynamic scenery image artifacts may be minimized while maintaining the desired total exposure time. However, U.S. 2015/009375 does not teach at least the following aspects of the present invention: Gated sensors, synchronization with and sensing of flickering light sources, aggregation of multiple images at the accumulation portion, the spectral filters and backside illuminated sensors.

U.S. Patent Application Publication No. 2015/0156387 teaches an image sensor including an imaging element that generates a pixel signal through photoelectric conversion with a variable exposure time; and an accumulation unit that accumulates the pixel signal generated by the imaging element, in which the imaging element repeatedly generates the pixel signal through the photoelectric conversion for each of the divided exposure time periods obtained by dividing a necessary exposure time which is necessary for imaging an image into multiple time periods at intervals of a predetermined time within an imaging time of one frame image, and the accumulation unit accumulates the pixel signal generated by the imaging element and outputs the pixel signal accumulated in the necessary exposure time. However, U.S. 2015/0156387 does not teach at least the following aspects of the present invention: Gated sensors, synchronization with and sensing of flickering light sources, aggregation of multiple images at the accumulation portion, the spectral filters and backside illuminated sensors.

In the above description, an embodiment is an example or implementation of the invention. The various appearances of "one embodiment", "an embodiment", "certain embodiments" or "some embodiments" do not necessarily all refer to the same embodiments.

Although various features of the invention may be described in the context of a single embodiment, the features may also be provided separately or in any suitable combination. Conversely, although the invention may be described herein in the context of separate embodiments for clarity, the invention may also be implemented in a single embodiment.

Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone.

Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described.

Meanings of technical and scientific terms used herein are to be commonly understood as by one of ordinary skill in the art to which the invention belongs, unless otherwise defined.

While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

The invention claimed is:

1. An imaging and/or ranging system comprising a pulsed illuminator and at least one gated imaging array comprising a plurality of single pixel sensors, wherein at least one of the single pixel sensors comprises:
    a photosensor configured to convert light into proportional signals;
    a charge storage configured to accumulate, repeatedly, a plurality of the signals converted by the photosensor;
    a first transistor coupled between a pixel voltage terminal and the photosensor;
    a second transistor coupled between the photosensor and the charge storage; and
    a readout circuit coupled between the charge storage and an output channel,
    wherein the single pixel sensor is configured to carry out the repeated accumulations of signals multiple times per each readout by the readout circuit, to synchronously convert reflections of light emitted by the illuminator, and
    wherein the single pixel sensor is further configured such that the period of at least one of the repeated accumulations of signals at least partially overlaps the period of at least one light pulse generated by the pulsed illuminator.

2. The system of claim 1, further configured to generate images of a scene from the readout circuit and to adjust the at least partial overlap to enhance short range image elements.

3. The system of claim 1, further configured to adjust the at least partial overlap according to requirements from an associated advanced driver assistance system (ADAS) and/or autonomous driving functions.

4. The system of claim 1, further configured to apply indirect time of flight (iTOF) algorithms with respect to the at least partial overlap.

5. The system of claim 1, further configured to carry out image processing prior to outputting a video signal.

6. The system of claim 5, wherein the image processing further comprises combining data from at least one of: one or more image frames, one or more pixel clusters, multiple pixels and image frames captured with different partial overlaps.

7. The system of claim 5, further comprising data storage configured to store the image frames readouts temporarily, wherein the image processing is carried out with respect to stored image frames readouts.

8. The system of claim 1, further configured to synchronize its output according to a predefined video protocol.

9. The system of claim 1, further configured to derive a scene visibility from at least one of the repeated accumulations.

10. The system of claim 9, further configured to adjust operation parameters of the at least one gated imaging array according to the derived scene visibility.

11. The system of claim 9, further configured to adjust the at least partial overlap according to the derived scene visibility.

12. The system of claim 9, wherein the scene visibility comprises an environmental backscattering measure.

13. The system of claim 9, further configured to derive the scene visibility from at least one of the repeated accumulations that at least partially overlaps at least one light pulse.

14. The system of claim 13, further configured to derive the scene visibility at different distances from the illuminator according to a measure of the at least partial overlap between the at least one of the repeated accumulations and the at least one light pulse.

15. The imaging system of claim 14, further configured to determine the at least partial overlap and the at least one overlapped light pulse according to the scene visibility at different distances from the illuminator.

16. The imaging system of claim 1, further configured to determine the at least partial overlap and the at least one overlapped light pulse according to a scene visibility at different distances from the illuminator.

17. The imaging system of claim 1, wherein specified pixel clusters in the at least one gated imaging array are further configured to operate with different durations of the signal accumulations.

18. The imaging system of claim 1, wherein specified pixel clusters in the at least one gated imaging array are further configured to operate with different partial overlap periods and the system is further configured to use at least one of the pixel clusters to collect ambient light, use a plurality of the pixel clusters to collect image signals and derive an image from the collected image signals and the collected ambient light.

19. The imaging system of claim 1, wherein the system is further configured to derive a functionality test result from at least one of the repeated accumulations.

20. The imaging system of claim 1, wherein the first transistor is configured to control a resetting of the photosensor and the first and second transistors are configured to control a transfer of the accumulated signal to the charge storage.

21. The imaging system of claim 1, further comprising a reset transistor coupled between the charge storage and the pixel voltage terminal and configured to reset the charge pixel storage after at least one signal readout and/or at beginnings of signal accumulation periods.

22. The imaging system of claim 1, further comprising a voltage controlling element connected to the charge storage and configured to determine a signal level in the charge storage.

23. The imaging system of claim 1, further configured to operate in SWIR (short wave infrared) and optionally in visible range.

24. A method comprising:
    accumulating, repeatedly, in a charge storage of a single pixel sensor, a plurality of signals that are proportionally converted by a photosensor from corresponding light,
    controlling a resetting of the photosensor by a first transistor coupled between a pixel voltage terminal and the photosensor, controlling a transfer of the accumulated signal to the charge storage by a second transistor coupled between the photosensor and the charge storage, and configuring the single pixel sensor to carry out the repeated accumulations of signals multiple times per each readout of the charge storage by a pixel readout circuit, wherein the single pixel sensor is configured to synchronously convert reflections of light emitted by an illuminator, and to carry out at least one of the repeated accumulations of signals in a period at least partially overlapping with a period of at least one light pulse generated by the pulsed illuminator.

25. The method of claim 24, further comprising deriving a scene visibility from at least one of the repeated accumulations.

26. The method of claim 24, further comprising adjusting at least one of the accumulating, the controlling and the at least partial overlap according a scene visibility.

27. The method of claim 24, further comprising adjusting different pixel clusters of the sensor to have different at least one of the accumulating, the controlling and the at least partial overlap, and fusing data from pixel readouts from the pixel clusters.

28. The method of claim 24, further comprising:

controlling, by the first transistor, a resetting of the photosensor prior to each signal accumulation period, and transferring, by the second transistor, at least a portion of the accumulated signal from the photosensor to the charge storage.

29. The method of claim 24, further comprising adjusting the at least partial overlap to enhance short range image elements.

30. The method of claim 24, further comprising adjusting the at least partial overlap according to ADAS and/or autonomous driving functions.

31. The method of claim 24, further comprising applying indirect time of flight algorithms with respect to the at least partial overlap.

32. The method of claim 24, further comprising processing at least one image frame and/or pixel clusters prior to outputting a video signal.

33. The method of claim 32, further comprising storing image frames readout temporarily and synchronizing the output according to a predefined video protocol.

* * * * *